US012777762B2

(12) United States Patent
Kashihara et al.

(10) Patent No.: US 12,777,762 B2
(45) Date of Patent: Oct. 27, 2026

(54) LIGHT-EMITTING DEVICE AND DISPLAY DEVICE HAVING AN ELECTRODE COUPLER ELECTRICALLY COUPLING A PLURALITY OF COMMON ELECTRODES

(71) Applicant: SONY SEMICONDUCTOR SOLUTIONS CORPORATION, Kanagawa (JP)

(72) Inventors: Hiroyuki Kashihara, Kanagawa (JP); Toshihiro Miura, Kanagawa (JP); Toshiaki Hasegawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 666 days.

(21) Appl. No.: 18/000,849

(22) PCT Filed: May 7, 2021

(86) PCT No.: PCT/JP2021/017461
§ 371 (c)(1),
(2) Date: Dec. 6, 2022

(87) PCT Pub. No.: WO2021/256113
PCT Pub. Date: Dec. 23, 2021

(65) Prior Publication Data

US 2023/0215904 A1 Jul. 6, 2023

(30) Foreign Application Priority Data

Jun. 16, 2020 (JP) ................................ 2020-103815

(51) Int. Cl.
*H10H 29/14* (2025.01)
*H10H 20/01* (2025.01)
(Continued)

(52) U.S. Cl.
CPC .... *H10H 29/142* (2025.01); *H10H 20/01335* (2025.01); *H10H 20/855* (2025.01);
(Continued)

(58) Field of Classification Search
CPC ................................ H10H 29/34; H10H 29/49
See application file for complete search history.

(56) References Cited

U.S. PATENT DOCUMENTS 11,398,500 B2 * 7/2022 Sakong .................. H10D 86/40
2004/0195576 A1 10/2004 Watanabe et al.
(Continued)

FOREIGN PATENT DOCUMENTS

CN 102197596 9/2011
CN 110100318 8/2019
(Continued)

OTHER PUBLICATIONS

International Search Report and Written Opinion prepared by the Japan Patent Office on Jun. 28, 2021, for International Application No. PCT/JP2021/017461, 3 pgs.

*Primary Examiner* — Aaron J Gray
(74) *Attorney, Agent, or Firm* — SHERIDAN ROSS P.C.

(57) ABSTRACT

A light-emitting device includes: a light-emitting element provided separately for each of pixels; a pixel electrode provided on a side of a first surface of the light-emitting element, the pixel electrode being provided for each of the pixels; a common electrode provided on a side of a second surface of the light-emitting element, the second surface being opposite to the first surface, the common electrode being provided separately for each of the pixels that are adjacent to each other; and an electrode coupler that electrically couples a plurality of the common electrodes pro-
(Continued)

vided for the respective pixels to each other in a plane region that is different from a plane region in which the light-emitting element is provided.

16 Claims, 36 Drawing Sheets

(51) Int. Cl.
*H10H 20/855* (2025.01)
*H10H 29/34* (2025.01)
*H10H 29/49* (2025.01)

(52) U.S. Cl.
CPC ............ *H10H 29/34* (2025.01); *H10H 29/49* (2025.01); *H10H 20/0363* (2025.01)

(56) References Cited

U.S. PATENT DOCUMENTS

| | | | | |
|---|---|---|---|---|
| 2011/0156616 | A1 | 6/2011 | Anderson et al. | |
| 2012/0169682 | A1* | 7/2012 | Kuhlman | H10K 59/123 345/205 |
| 2016/0118449 | A1* | 4/2016 | Sato | H10K 50/805 257/89 |
| 2017/0250318 | A1* | 8/2017 | Cha | H10H 20/8514 |
| 2018/0277591 | A1* | 9/2018 | Wu | H10H 20/856 |
| 2018/0358339 | A1 | 12/2018 | Iguchi | |
| 2019/0206849 | A1 | 7/2019 | Jang et al. | |
| 2019/0385513 | A1 | 12/2019 | Iguchi et al. | |
| 2021/0013236 | A1* | 1/2021 | Sakong | H10D 86/40 |

FOREIGN PATENT DOCUMENTS

| | | |
|---|---|---|
| CN | 110678985 | 1/2020 |
| EP | 2332185 | 6/2011 |
| JP | 2004-304161 | 10/2004 |
| JP | 2012-502482 | 1/2012 |
| JP | 2013-037138 | 2/2013 |
| JP | 2016-085913 | 5/2016 |
| JP | 2018-182282 | 11/2018 |
| JP | 2020-085944 | 6/2020 |
| JP | 2020086461 A | 6/2020 |
| KR | 2011-0053382 | 5/2011 |
| KR | 20170142022 A | 12/2017 |
| KR | 20170143336 A | 12/2017 |
| KR | 20200062863 A | 6/2020 |
| TW | 2010-21254 | 6/2010 |
| WO | WO 2010/028146 | 3/2010 |
| WO | WO 2017/094461 | 6/2017 |
| WO | WO 2018/116814 | 6/2018 |
| WO | WO 2019/135606 | 7/2019 |
| WO | WO 2020/100432 | 5/2020 |

* cited by examiner

LIGHT-EMITTING DEVICE AND DISPLAY DEVICE HAVING AN ELECTRODE COUPLER ELECTRICALLY COUPLING A PLURALITY OF COMMON ELECTRODES

CROSS REFERENCE TO RELATED APPLICATIONS

This application is a national stage application under 35 U.S.C. 371 and claims the benefit of PCT Application No. PCT/JP2021/017461, having an international filing date of 7 May 2021, which designated the United States, which PCT application claimed the benefit of Japanese Patent Application No. 2020-103815, filed 16 Jun. 2020, the entire disclosures of each of which are incorporated herein by reference.

TECHNICAL FIELD

The present disclosure relates to a light-emitting device and a display device.

BACKGROUND ART

A light emitting diode (LED) that converts electric energy into light energy has high response speed and low power consumption, and thus has attracted attention as a light source of a display device or the like (for example, PTL 1).

A display device including light emitting diodes is manufactured, for example, by: bonding a substrate in which the light emitting diodes are spread over a plurality of pixels to a substrate in which a driving circuit that causes the light emitting diodes to drive is provided; and thereafter providing, on the light emitting diodes, a fluorescent substance, a color filter, or the like for each pixel.

CITATION LIST

Patent Literature

PTL 1: Japanese Unexamined Patent Application Publication No. 2018-182282

SUMMARY OF THE INVENTION

Accordingly, there has been a demand for further reducing crosstalk (i.e., light leakage) between pixels in a light-emitting device such as a display device including a light emitting diode.

Accordingly, it is desirable to provide a light-emitting device and a display device that are each able to further reduce light leakage between adjacent pixels.

A light-emitting device according to one embodiment of the present disclosure includes: a light-emitting element provided separately for each of pixels; a pixel electrode provided on a side of a first surface of the light-emitting element, the pixel electrode being provided for each of the pixels; a common electrode provided on a side of a second surface of the light-emitting element, the second surface being opposite to the first surface, the common electrode being provided separately for each of the pixels that are adjacent to each other; and an electrode coupler that electrically couples a plurality of the common electrodes provided for the respective pixels to each other in a plane region that is different from a plane region in which the light-emitting element is provided.

A display device according to one embodiment of the present disclosure includes: a light-emitting element provided separately for each of pixels; a pixel electrode provided on a side of a first surface of the light-emitting element, the pixel electrode being provided for each of the pixels; a common electrode provided on a side of a second surface of the light-emitting element, the second surface being opposite to the first surface, the common electrode being provided separately for each of the pixels that are adjacent to each other; and an electrode coupler that electrically couples a plurality of the common electrodes provided for the respective pixels to each other in a plane region that is different from a plane region in which the light-emitting element is provided.

In the light-emitting device and the display device according to the embodiment of the present disclosure: the light-emitting element is provided separately for each of the pixels; the pixel electrode is provided on the side of the first surface of the light-emitting element; the common electrode is provided on the side of the second surface of the light-emitting element, the second surface being opposite to the first surface, the common electrode being provided separately for each of the pixels that are adjacent to each other; and the common electrodes are electrically coupled to each other by the electrode coupler that is provided in the plane region that is different from the plane region in which the light-emitting element is provided. Accordingly, for example, the light-emitting device and the display device of the embodiment are each able to separate the pixel electrode, the light-emitting element, and the common electrode included in one pixel from the pixel electrode, the light-emitting element, and the common electrode included in a pixel adjacent to the one pixel.

MODES FOR CARRYING OUT THE INVENTION

Figure 1:
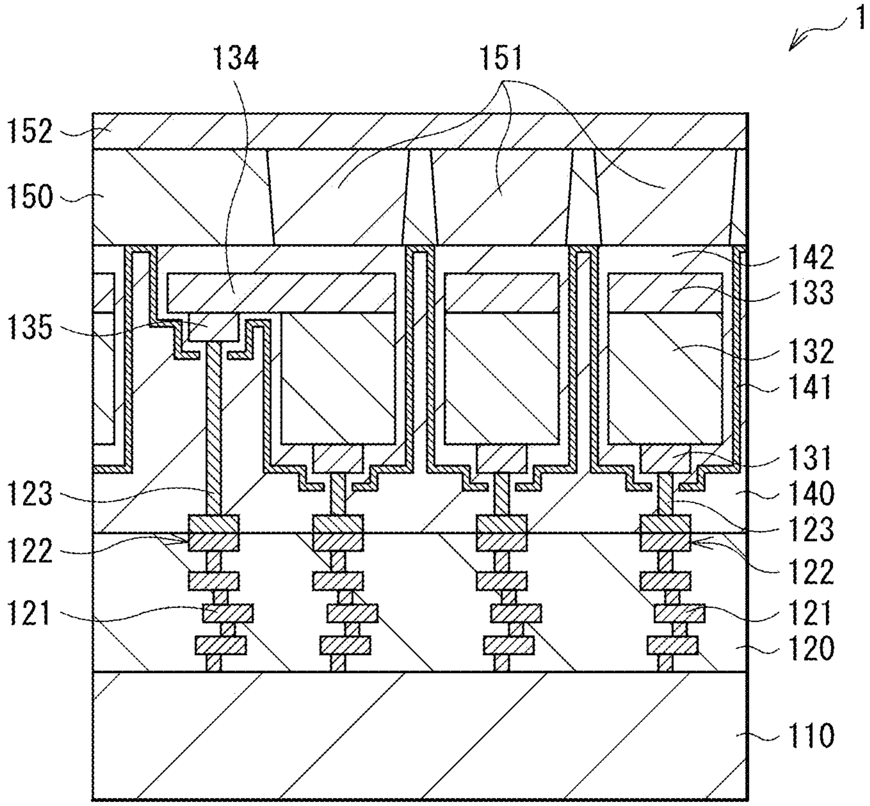
FIG. 1 is a vertical cross-sectional view of an overall configuration of a light-emitting device according to a first embodiment of the present disclosure.

The following describes embodiments of the present disclosure in detail with reference to the drawings. The following description is a specific example of the present disclosure, but the present disclosure is not limited to the following embodiments. In addition, the present disclosure is not limited to arrangement, dimensions, dimensional ratios, and the like of the constituent elements illustrated in the drawings.

It is to be noted that description is given in the following order.

1. First Embodiment
    - 1.1. Overall Configuration
    - 1.2. Detailed Configuration
    - 1.3. Manufacturing Method
    - 1.4. Modification Examples
2. Second Embodiment
    - 2.1. Overall Configuration
    - 2.2. Detailed Configuration
    - 2.3. Manufacturing Method
    - 2.4. Modification Examples
3. Third Embodiment
    - 3.1. Overall Configuration
    - 3.2. Detailed Configuration
    - 3.3. Manufacturing Method
    - 3.4. Modification Examples
4. Application Examples

1. First Embodiment (1.1. Overall Configuration)

First, with reference to FIG. 1, an overall configuration of a light-emitting device according to a first embodiment of the present disclosure will be described. FIG. 1 is a vertical cross-sectional view of the overall configuration of the light-emitting device according to the present embodiment.

As illustrated in FIG. 1, a light-emitting device 1 according to the present embodiment includes, for example, a light-emitting element 132, a pixel electrode 131, a common electrode 133, an electrode coupler 134, a contact section 135, a light-shielding section 141, insulating layers 140 and 142, a fluorescent layer 151, a pixel separation layer 150, a protective layer 152, a through via 123, a metal junction 122, a multilayer wiring layer 121, an interlayer insulating layer 120, and a drive substrate 110. The light-emitting device 1 is, for example, a display device that performs RGB color display by converting light emitted from the light-emitting element 132 separated for each pixel into red light, green light, or blue light by the fluorescent layer 151.

The light-emitting element 132 is provided separately for each pixel, and is a self-luminous compound semiconductor layer that emits light by application of an electric field. In the light-emitting element 132, electrons are injected from one electrode and holes are injected from another electrode. The injected electrons and holes are combined inside the light-emitting element 132 to emit light corresponding to a band gap of the compound semiconductor included in the light-emitting element 132.

Specifically, the light-emitting element 132 has a group III-V compound semiconductor stacked structure. For example, the light-emitting element 132 may have a stacked structure of: p-GaN (p-type impurity doped GaN); p-AlGaN (p-type impurity doped AlGaN); a multi-quantum-well structure (MQWs) in which multiple structures are stacked on each other, the multiple structures each including an ultra-thin layer having a small band gap sandwiched by a layer having a large band gap; n-GaN (n-type impurity doped GaN); and u-GaN (undoped GaN).

The pixel electrode 131 is an electrode that is able to apply independent potential for each pixel, and is provided for each pixel on a first surface side (i.e., on a lower side in FIG. 1) of the light-emitting element 132. For example, the pixel electrode 131 may have a single-layer structure or a multiple-layer stacked structure including a metal material such as Pd, Ti, TiN, W, Al, Cu, Pt, Ag, Ni, or Au, or a transparent electrically conductive material such as ITO (Indium Tin Oxide), IZO (Indium Zinc Oxide), or ZnO.

The common electrode 133 is an electrode that is able to apply common potential to a plurality of pixels, and is provided over the plurality of pixels by being electrically coupled to the plurality of pixels on a second surface side (i.e., on an upper side in FIG. 1) of the light-emitting element 132, the second surface side being opposite to the first surface side. For example, the common electrode 133 may have a single-layer structure or a multiple-layer stacked structure including a transparent electrically conductive material such as ITO (Indium Tin Oxide), IZO (Indium Zinc Oxide), ZnO, SnO, or TiO.

In the light-emitting device 1, it is possible to reduce the number of electrical connections between the light-emitting element 132 and the drive substrate 110 by making one of the electrodes (i.e., the common electrode 133) which applies the electric field to the light-emitting element 132 common for each pixel. This makes it possible to more easily electrically couple the light-emitting element 132 and the drive substrate 110 to each other even if the pixels are miniaturized.

Here, the common electrode 133 is provided separately for each of adjacent pixels. The common electrodes 133 of the respective pixels are electrically coupled to each other by the electrode coupler 134, which makes it possible to apply common potential to the plurality of pixels.

The electrode coupler 134 is provided in a plane region that is different from a plane region in which the light-emitting element 132 is provided, and electrically couples the common electrodes 133 of the respective pixels. Specifically, the electrode coupler 134 may be provided in such a manner as to protrude in the plane region that is different from the plane region in which the light-emitting element 132 is provided, may include a material identical to a material of the common electrode 133, and may be provided on the same layer as and integrally with the common electrode 133. Details of the electrode coupler 134 will be described later with reference to FIG. 2.

The contact section 135 is provided on the same side as the pixel electrode 131 with respect to the electrode coupler 134. The contact section 135 is provided on the electrode coupler 134 protruding from the region on which the light-emitting element 132 is provided, thereby being electrically coupleable to the common electrode 133 from a side identical to a side on which the pixel electrode 131 is present. For example, the contact section 135 may have a single-layer structure or a multiple-layer stacked structure including a metal material such as Pd, Ti, TiN, W, Al, Cu, Pt, Ag, Ni, or Au, or a transparent electrically conductive material such as ITO (Indium Tin Oxide), IZO (Indium Zinc Oxide), or ZnO.

The light-shielding section 141 includes a light-shielding material, and is provided in such a manner as to cover a drive substrate 110 side of the light-emitting element 132, the pixel electrode 131, the common electrode 133, the electrode coupler 134, and the contact section 135. The light-shielding section 141 may include a metal material such as W, Ti, TiN, Cu, Al, or Ni, or an organic material such as carbon.

Specifically, the light-shielding section 141 is provided in such a manner as to cover the drive substrate 110 side with respect to the light-emitting element 132 and to open a fluorescent layer 151 side. The light-shielding section 141 is thus able to prevent the light emitted from the light-emitting element 132 from proceeding toward the drive substrate 110 side.

Further, the light-shielding section 141 is provided in such a manner as to separate the light-emitting elements 132 of the respective pixels away from each other. In the light-emitting device 1, the light-emitting element 132 is provided separately for each pixel. Thus, it is possible to provide the light-shielding section 141 between the light-emitting elements 132 of the respective pixels. According to this, the light-emitting device 1 is able to further suppress the light leakage between the pixels.

The insulating layers 140 and 142 each include an insulating material, and are provided in such a manner as to fill the periphery of the light-emitting element 132, the pixel electrode 131, and the common electrode 133. The insulating layers 140 and 142 each electrically insulate the light-emitting element 132, the pixel electrode 131, and the common electrode 133 on a per-pixel basis, thereby making it possible for the light-emitting element 132 to drive on a per-pixel basis. The insulating layers 140 and 142 may each include, for example, an insulating oxynitride such as $SiO_x$, $SiN_x$, SiON, or $Al_2O_3$.

The fluorescent layer 151 includes a light-converting material that converts a color of the light emitted from the light-emitting element 132. The fluorescent layer 151 is provided, for example, on a side not covered with the light-shielding section 141 correspondingly to the light-emitting element 132 of each pixel. For example, the fluorescent layer 151 may convert blue light emitted from the light-emitting element 132 into red light and green light, which makes it possible for the light-emitting device 1 to emit light of three primary colors of red, green, and blue. Alternatively, the fluorescent layer 151 may convert white light emitted from the light-emitting element 132 into blue light, red light, and green light, which makes it possible for the light-emitting device 1 to emit light of three primary colors of red, green, and blue. As the light-converting material, the fluorescent layer 151 may include, for example, an inorganic fluorescent material, an organic fluorescent material, quantum dots, or the like.

The pixel separation layer 150 is provided to separate the fluorescent layers 151 away from each other for the respective pixels between the fluorescent layers 151, in order to prevent mixing of the light-converting material between the pixels. The pixel separation layer 150 may include a material having a light shielding property (or a material that is not transparent) in order to suppress color mixing between the pixels.

The protective layer 152 is a layer that protects the fluorescent layer 151 and the like from an external environment, and is provided on the side opposite to the side on which light-emitting element 132 is provided with respect to the fluorescent layer 151. The protective layer 152 may be provided as a single-layer film including, for example, one of light-transmissive insulating materials including $SiO_x$, $SiN_x$, SiON, $Al_2O_3$, and the like, or as a stacked film including two or more of such light-transmissive insulating materials. Alternatively, the protective layer 152 may include a light-transmissive inorganic material such as borosilicate glass, quartz glass, or sapphire glass, or a light-transmissive organic material such as acrylic resin.

The through via 123 includes an electrically conductive material, and extends from the pixel electrode 131 or the contact section 135 toward the drive substrate 110. The through via 123 is able to electrically couple the pixel electrode 131 or the contact section 135 to the metal junction 122 which is provided at an interface between the insulating layer 140 and the interlayer insulating layer 120. For example, the through via 123 may have a single-layer structure or a multiple-layer stacked structure including a metal material such as Pd, Ti, TiN, W, Al, Cu, Pt, Ag, Ni, or Au.

The metal junction 122 includes a metal such as Cu, and is provided at the interface between the insulating layer 140 and the interlayer insulating layer 120. Specifically, the metal junction 122 is provided by bonding an electrode exposed on the insulating layer 140 and an electrode exposed on the interlayer insulating layer 120 when the insulating layer 140 provided with the light-emitting element 132 and the interlayer insulating layer 120 on which the drive substrate 110 is stacked are attached to each other. The metal junction 122 is able to electrically couple the through via 123 provided in the insulating layer 140 and the multilayer wiring layer 121 provided in the interlayer insulating layer 120 to each other. According to this, the light-emitting device 1 is able to electrically couple the through via 123 and the multilayer wiring layer 121 to each other by a simple structure such as the metal junction 122. This makes it possible to further simplify a wiring configuration.

The multilayer wiring layer 121 includes an electrically conductive material, and is a wiring line provided over a plurality of layers inside the interlayer insulating layer 120. The multilayer wiring layer 121 is able to electrically couple the metal junction 122 provided at the interface between the insulating layer 140 and the interlayer insulating layer 120 to each of elements provided on the drive substrate 110. The multilayer wiring layer 121 may have a single-layer structure or a multiple-layer stacked structure including a metal material such as Pd, Ti, TiN, W, Al, Cu, Pt, Ag, Ni, or Au.

The interlayer insulating layer 120 includes an insulating material, and electrically separates the respective wiring lines of the multilayer wiring layers 121 from each other. The interlayer insulating layer 120 may include, for example, an insulating oxynitride such as $SiO_x$, $SiN_x$, SiON, or $Al_2O_3$.

The drive substrate 110 includes a circuit that drives the light-emitting elements 132 of the respective pixels. The drive substrate 110 may be, for example, a semiconductor substrate including Si or the like, or a resin substrate including PCB (Poly Chlorinated Biphenyl) or the like.

For example, the drive substrate 110 may include: a pixel circuit that individually drives the light-emitting element 132 for each pixel; and a common circuit that scans each pixel vertically or horizontally. The pixel circuit includes a plurality of MOSFETs (Metal-Oxide-Semiconductor Field-Effect Transistors), and is provided for each pixel. The pixel circuit is electrically coupled to, for example: the contact section 135 that is electrically coupled to the common electrode 133; and the pixel electrode 131 of each pixel. The common circuit includes a vertical drive circuit and a horizontal drive circuit for sequentially scanning each of the vertical and horizontal drive lines perpendicular to each other. Each intersection of the vertical drive line and the horizontal drive line corresponds to each pixel, and the light-emitting device 1 is able to drive each pixel by sequentially driving the vertical drive line and the horizontal drive line included in the common circuit.

(1.2. Detailed Configuration)

Figure 2:
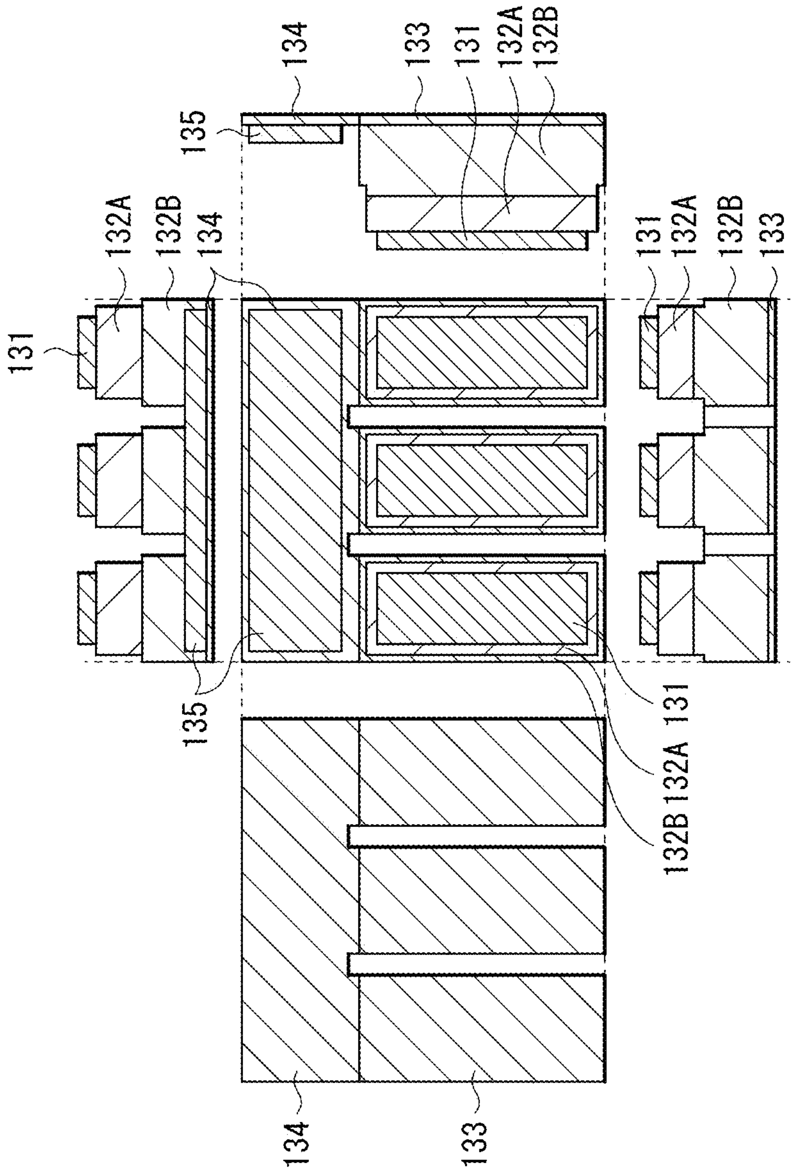
FIG. 2 is an orthographic view in which a pixel electrode, a light-emitting element, a common electrode, an electrode coupler, and a contact section are extracted.

Next, with reference to FIG. 2, a detailed configuration of the light-emitting device 1 according to the present embodiment will be described. FIG. 2 is an orthographic view in which the pixel electrode 131, the light-emitting element 132, the common electrode 133, the electrode coupler 134, and the contact section 135 are extracted.

As illustrated in FIG. 2, the common electrode 133, a second light-emitting element 132B, a first light-emitting element 132A, and the pixel electrode 131 are stacked in order. The first light-emitting element 132A corresponds, for example, to a stacked structure of p-GaN, p-AlGaN, and the multi-quantum-well structure (MQWs), and the second light-emitting element 132B corresponds, for example, to a stacked structure of n-GaN, and u-GaN. The first light-emitting element 132A and the second light-emitting element 132B configure the light-emitting element 132.

Here, the second light-emitting element 132B, the first light-emitting element 132A, and the pixel electrode 131 each have an island shape, and the island shape is provided separately for each pixel. The common electrode 133 is provided separately for each of the adjacent pixels. The common electrodes 133 of the respective pixels are electrically coupled to each other by the electrode coupler 134 which protrudes from the region provided with the first light-emitting element 132A and the second light-emitting element 132B. It is to be noted that the contact section 135 to be an electric contact with the common electrode 133 is further provided on the electrode coupler 134 which protrudes from the region provided with the first light-emitting element 132A and the second light-emitting element 132B.

The electrode coupler 134 may be provided integrally with and may include a material identical to the common electrode 133 as a layer contiguous to the common electrode 133. In other words, as with the common electrode 133, the electrode coupler 134 may have a single-layer structure or a multiple-layer stacked structure including a transparent electrically conductive material such as ITO, IZO, ZnO, SnO, or TiO. Further, the electrode coupler 134 may be electrically coupled to the common electrodes 133 of the respective pixels from a side in an identical direction on a plane. In such a case, the electrode coupler 134, and the common electrodes 133 of the respective pixels are provided in such a manner as to have a planar shape of a comb.

In a case where the electrode coupler 134 is provided as a layer contiguous to the common electrodes 133, the electrode coupler 134 and the common electrodes 133 are formed into films and shaped at the same time, thereby reducing the number of processes. Further, the electrode coupler 134 is able to limit a propagation path of light by being shaped, which makes it possible to further suppress the light leakage between the pixels through the common electrode 133 and the electrode coupler 134. In addition, a refractive index difference between air (having a refractive index of 1.0) and ITO (having a refractive index of about 2.0) is smaller than a refractive index difference between the air (having the refractive index of 1.0) and GaN (having a refractive index of about 2.5), thus, in a case where the electrode coupler 134 includes the same transparent electrically conductive material as the common electrode 133, the electrode coupler 134 suppresses reflection at an interface with the air, thereby further suppressing the light leakage between the pixels through the electrode coupler 134.

The light-emitting device 1 according to the present embodiment includes the light-emitting element 132 provided in the island-shaped structure separately for each pixel, and is therefore able to suppress the light leakage between the pixels as compared with a case where the light-emitting element 132 having a structure of being provided over the plurality of pixels. Further, in the light-emitting device 1, the common electrodes 133 to which common potential is supplied for the respective pixels are separated from each other between the pixels, and are electrically coupled to each other by the electrode coupler 134 protruded from the region provided with the light-emitting element 132. According to this, the common electrode 133 is able to suppress the light leakage between the pixels through the common electrode 133.

(1.3. Manufacturing Method)

Figure 3A:
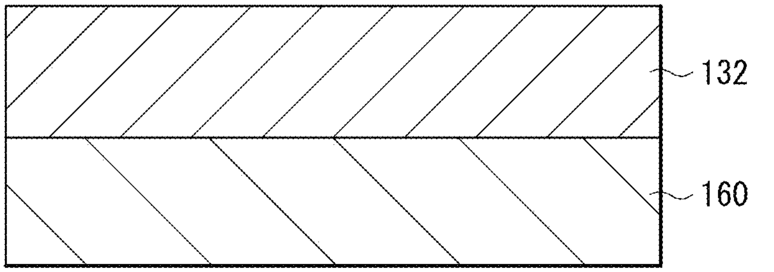
FIG. 3A is a vertical cross-sectional view of one process included in a method of manufacturing the light-emitting device according to the embodiment.

Next, referring to FIGS. 3A to 3U, a method of manufacturing the light-emitting device 1 according to the present embodiment will be described. FIGS. 3A to 3U are each a vertical cross-sectional view of one process included in the method of manufacturing the light-emitting device 1 according to the present embodiment.

First, as illustrated in FIG. 3A, the light-emitting element 132 is formed by epitaxially growing the group III-V compound semiconductor on a crystal growth substrate 160 including Si, sapphire, or the like. The light-emitting element 132 may be formed by sequentially stacking the group III-V compound semiconductors in the order of, for example, p-GaN, p-AlGaN, the multi-quantum-well structure (MQWs), n-GaN, and u-GaN.

Figure 3B:
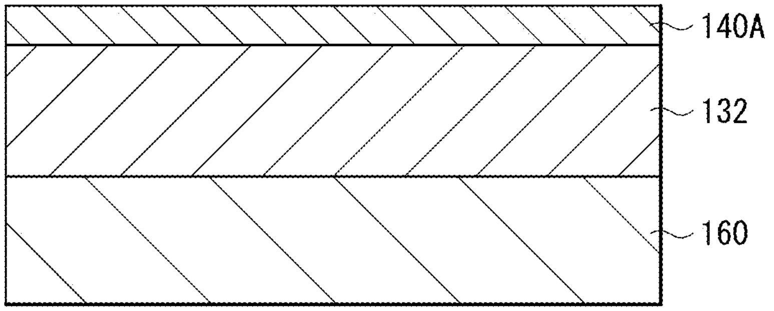
FIG. 3B is a vertical cross-sectional view of one process included in the method of manufacturing the light-emitting device according to the embodiment.

Thereafter, as illustrated in FIG. 3B, a film of $SiO_x$ or the like is formed on the light-emitting element 132 to thereby form an oxide film 140A. The oxide film 140A is provided, for example, to bond a support substrate 161 to the light-emitting element 132 in a process of a subsequent stage.

Figure 3C:
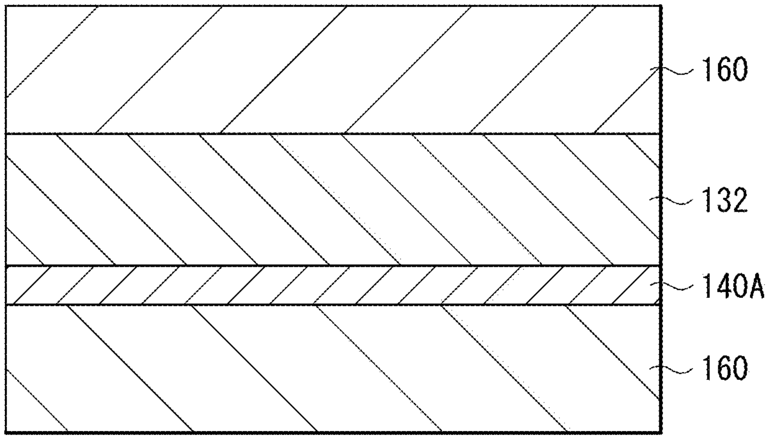
FIG. 3C is a vertical cross-sectional view of one process included in the method of manufacturing the light-emitting device according to the embodiment.

Thereafter, as illustrated in FIG. 3C, the support substrate 161 is bonded to the oxide film 140A. As the support substrate 161, for example, a Si substrate or the like may be used. It is to be noted that FIG. 3C is flipped vertically with respect to FIG. 3B.

Figure 3D:
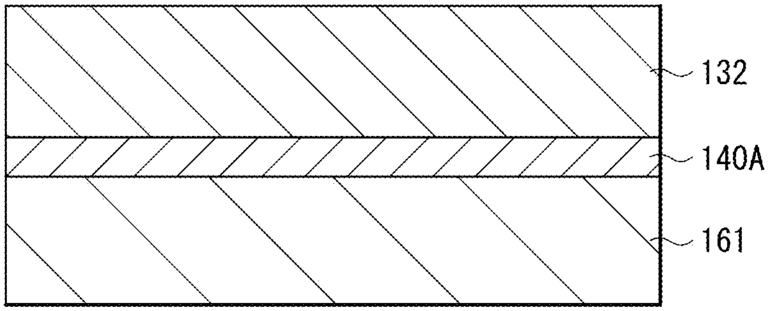
FIG. 3D is a vertical cross-sectional view of one process included in the method of manufacturing the light-emitting device according to the embodiment.

Thereafter, as illustrated in FIG. 3D, the crystal growth substrate 160 is removed from the light-emitting element 132. Specifically, the crystal growth substrate 160 may be removed from the light-emitting element 132 by grinding with a grinder, wet etching, or the like. The crystal growth substrate 160 may also be removed from the light-emitting element 132 by CMP (Chemical Mechanical Polishing), dry etching, or the like.

Figure 3E:
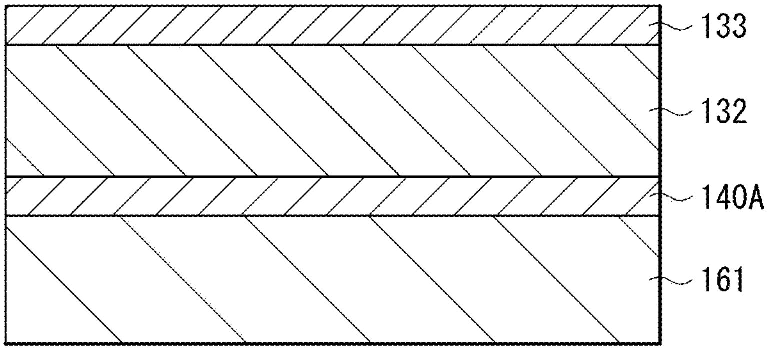
FIG. 3E is a vertical cross-sectional view of one process included in the method of manufacturing the light-emitting device according to the embodiment.

Thereafter, as illustrated in FIG. 3E, a film of a transparent electrically conductive material such as ITO is formed on the light-emitting element 132 to thereby form the common electrode 133 including the electrode coupler 134.

Figure 3F:
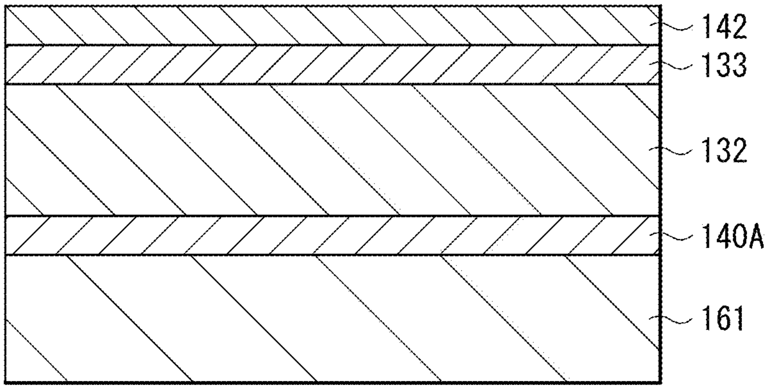
FIG. 3F is a vertical cross-sectional view of one process included in the method of manufacturing the light-emitting device according to the embodiment.

Thereafter, as illustrated in FIG. 3F, a film of $SiO_x$ is formed on the common electrode 133 to thereby form the insulating layer 142.

Figure 3G:
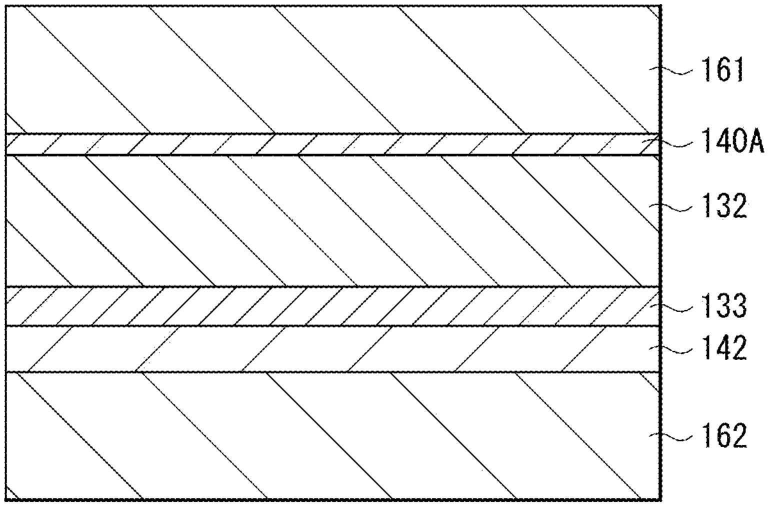
FIG. 3G is a vertical cross-sectional view of one process included in the method of manufacturing the light-emitting device according to the embodiment.

Thereafter, as illustrated in FIG. 3G, a support substrate 162 is bonded to the insulating layer 142. As the support substrate 162, for example, a Si substrate or the like may be used. It is to be noted that FIG. 3G is flipped vertically with respect to FIG. 3F.

Figure 3H:
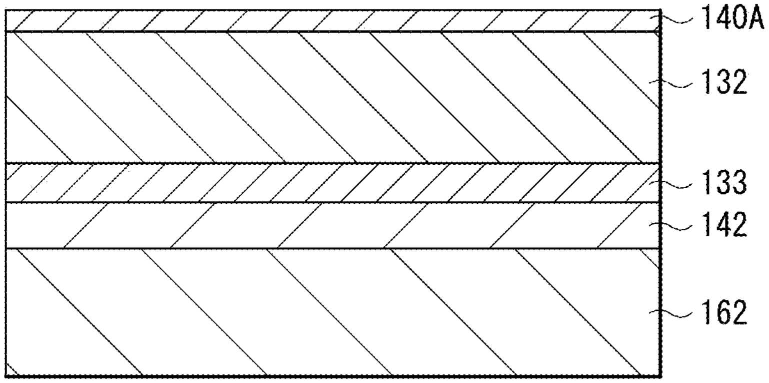
FIG. 3H is a vertical cross-sectional view of one process included in the method of manufacturing the light-emitting device according to the embodiment.

Thereafter, as illustrated in FIG. 3H, the support substrate 161 is removed from top of the oxide film 140A. For example, the support substrate 161 may be removed from the top of the oxide film 140A by grinding with a grinder, wet etching, or the like.

Figure 3I:
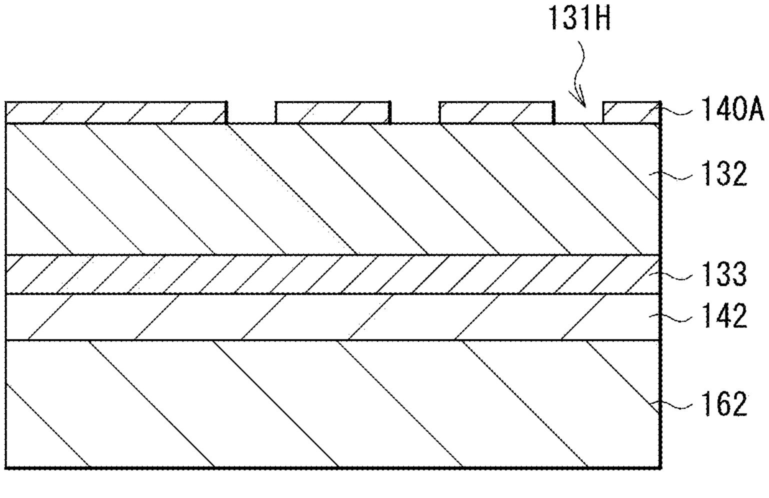
FIG. 3I is a vertical cross-sectional view of one process included in the method of manufacturing the light-emitting device according to the embodiment.

Thereafter, as illustrated in FIG. 3I, the oxide film 140A is patterned using lithography and etching to thereby form an opening 131H in the oxide film 140A. The opening 131H is provided to form the pixel electrode 131 in a process of a subsequent stage.

Figure 3J:
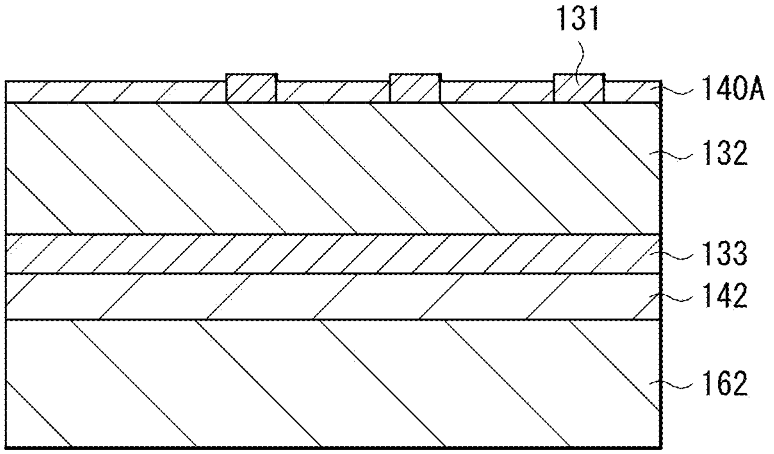
FIG. 3J is a vertical cross-sectional view of one process included in the method of manufacturing the light-emitting device according to the embodiment.

Thereafter, as illustrated in FIG. 3J, a film of a metal material such as Pd, Ti, TiN, W, Al, Cu, Pt, Ag, Ni, or Au is formed in such a manner as to fill the opening 131H to thereby form the pixel electrode 131.

Figure 3K:
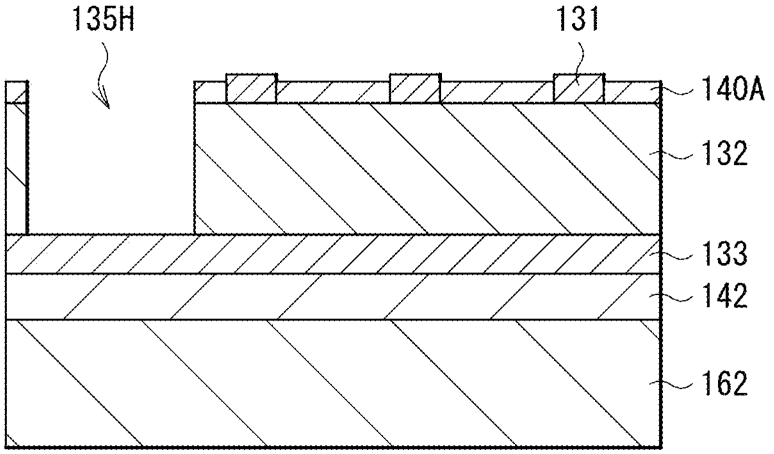
FIG. 3K is a vertical cross-sectional view of one process included in the method of manufacturing the light-emitting device according to the embodiment.

Thereafter, as illustrated in FIG. 3K, the oxide film 140A and the light-emitting element 132 are patterned using lithography and etching to thereby form an opening 135H in the oxide film 140A and the light-emitting element 132 which are in a region that is different from a region in which the pixel electrode 131 has been formed. The opening 135H is provided to form the contact section 135 in a process of a subsequent stage, and the transparent electrically conductive material exposed by the opening 135H becomes the electrode coupler 134.

Figure 3L:
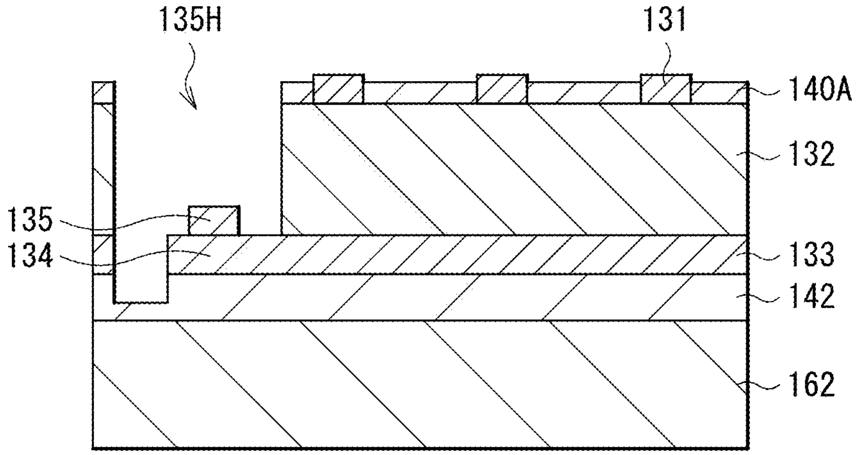
FIG. 3L is a vertical cross-sectional view of one process included in the method of manufacturing the light-emitting device according to the embodiment.

Thereafter, as illustrated in FIG. 3L, a film of a metal material such as Pd, Ti, TiN, W, Al, Cu, Pt, Ag, Ni, or Au is formed on the electrode coupler 134 inside the opening 135H to thereby form the contact section 135.

Figure 3M:
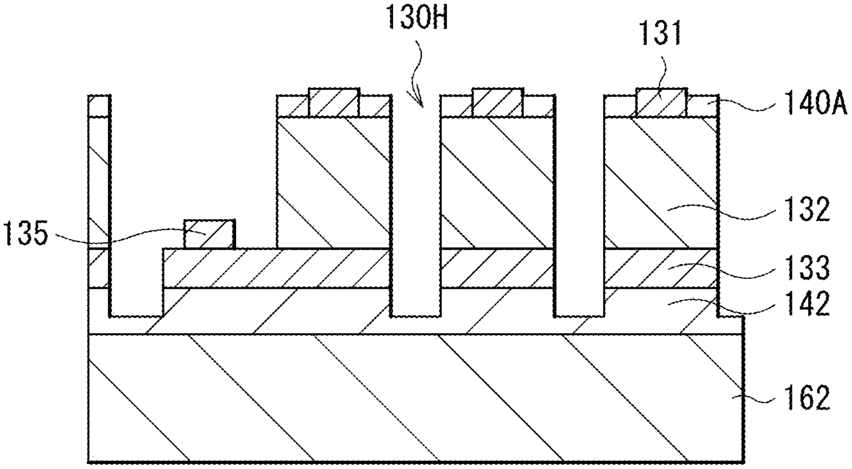
FIG. 3M is a vertical cross-sectional view of one process included in the method of manufacturing the light-emitting device according to the embodiment.

Thereafter, as illustrated in FIG. 3M, the oxide film 140A, the light-emitting element 132, the common electrode 133, and the insulating layer 142 are patterned by lithography and etching to thereby form an opening 130H that separates the light-emitting elements 132 from each other for each pixel. At this time, the opening 130H is formed in such a manner that the common electrodes 133 of the respective pixels are electrically coupled by the electrode coupler 134 while the light-emitting elements 132 are separated from each other for each pixel.

Figure 3N:
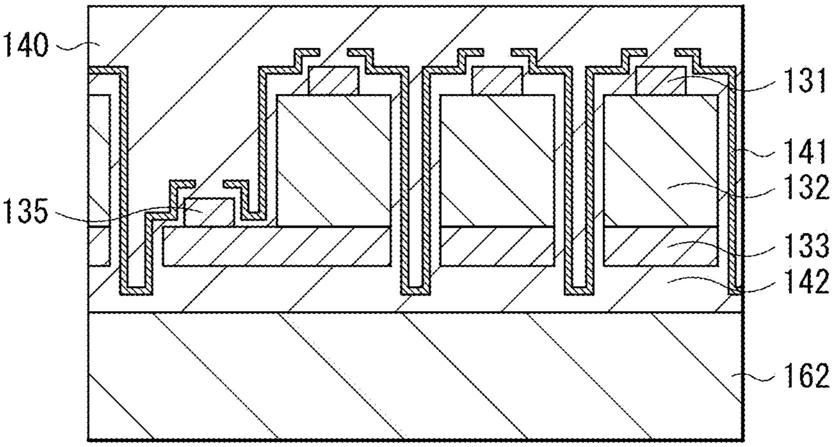
FIG. 3N is a vertical cross-sectional view of one process included in the method of manufacturing the light-emitting device according to the embodiment.

Thereafter, as illustrated in FIG. 3N, the insulating layer 140 and the light-shielding section 141 are formed in such a manner as to fill the pixels. The insulating layer 140 is provided, for example, by forming a film of $SiO_x$ or the like using CVD (Chemical Vapor Deposition) or the like. Further, the light-shielding section 141 is formed by forming a film of a metal material such as W, Ti, TiN, Cu, Al, or Ni except on the pixel electrode 131 and the contact section 135.

Figure 3O:
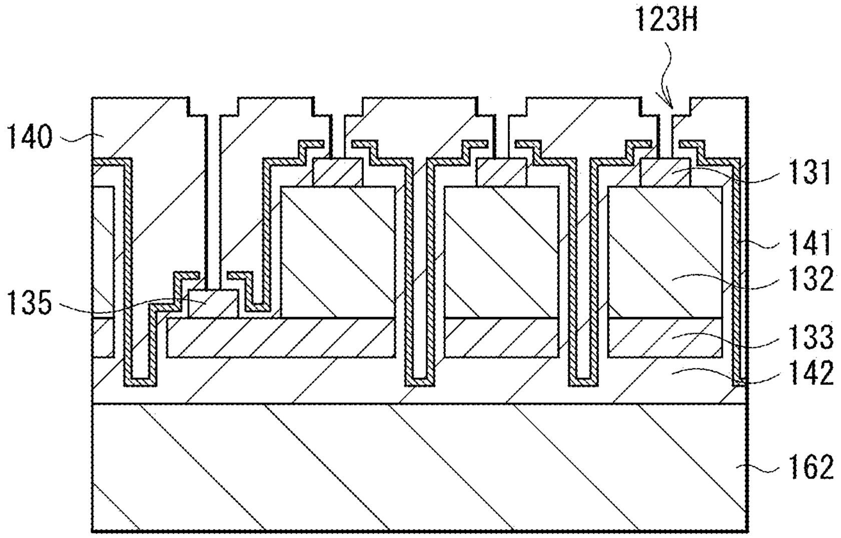
FIG. 3O is a vertical cross-sectional view of one process included in the method of manufacturing the light-emitting device according to the embodiment.

Thereafter, as illustrated in FIG. 3O, the insulating layer 140 is patterned by lithography and etching to thereby form an opening 123H in the insulating layer 140 in each of a region corresponding to the pixel electrode 131 and a region corresponding to the contact section 135. The opening 123H is provided to form the through via 123 to be electrically coupled to each of the pixel electrode 131 and the contact section 135 in a process of a subsequent stage.

Figure 3P:
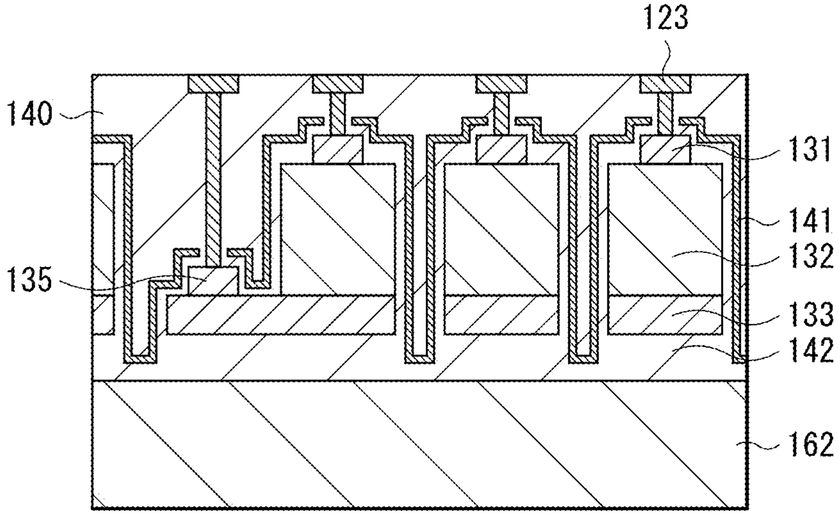
FIG. 3P is a vertical cross-sectional view of one process included in the method of manufacturing the light-emitting device according to the embodiment.

Thereafter, as illustrated in FIG. 3P, a film of a metal material such as Pd, Ti, TiN, W, Al, Cu, Pt, Ag, Ni, or Au is formed in such a manner as to fill the opening 123H to thereby form the through via 123. It is to be noted that an electrode to be the metal junction 122 is formed on the through via 123 in a process of a subsequent stage.

Figure 3Q:
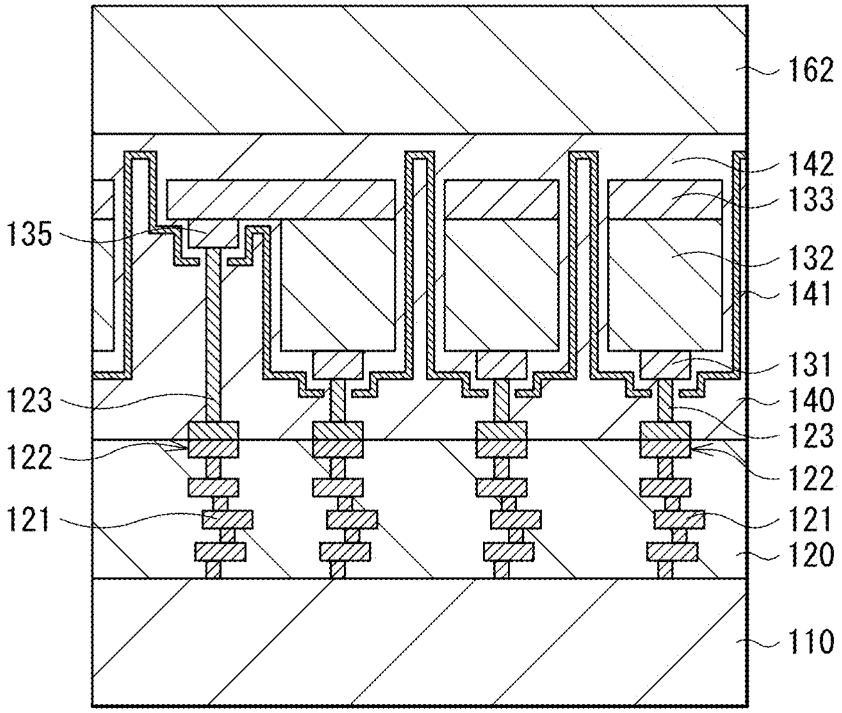
FIG. 3Q is a vertical cross-sectional view of one process included in the method of manufacturing the light-emitting device according to the embodiment.

Thereafter, as illustrated in FIG. 3Q, the drive substrate 110 on which the interlayer insulating layer 120 including the multilayer wiring layer 121 is stacked is attached to the stacked structure formed in the processes of FIGS. 3A to 3P. Specifically, the stacked structure formed in the processes of FIGS. 3A to 3P and the drive substrate 110 are attached to each other in such a manner that the insulating layer 140 and the interlayer insulating layer 120 are opposed to each other. Here, at the interface between the insulating layer 140 and the interlayer insulating layer 120, the electrodes exposed on the respective surfaces are bonded to each other to thereby form the metal junction 122. It is to be noted that FIG. 3Q is flipped vertically with respect to FIG. 3P.

Figure 3R:
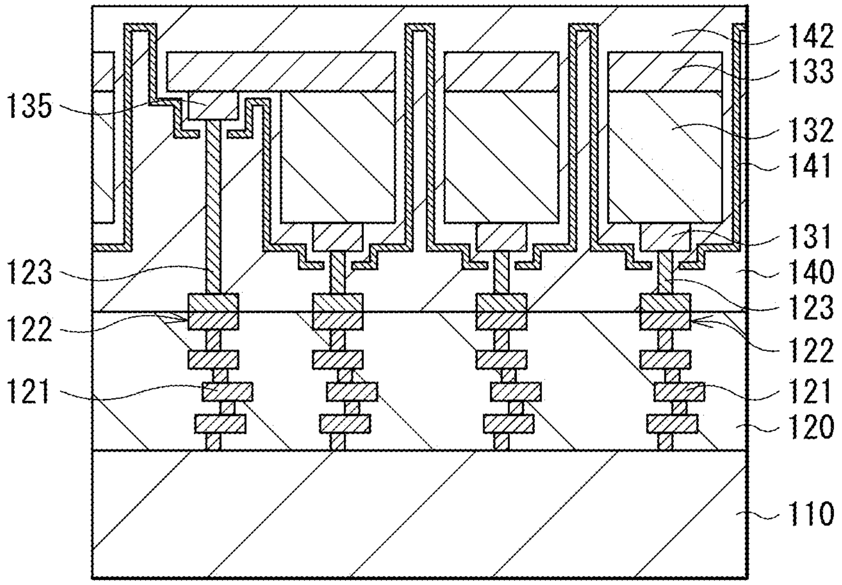
FIG. 3R is a vertical cross-sectional view of one process included in the method of manufacturing the light-emitting device according to the embodiment.

Thereafter, as illustrated in FIG. 3R, the support substrate 162 is removed from top of the insulating layer 142. For example, the support substrate 162 may be removed from the top of the insulating layer 142 by grinding with a grinder, wet etching, or the like.

Figure 3S:
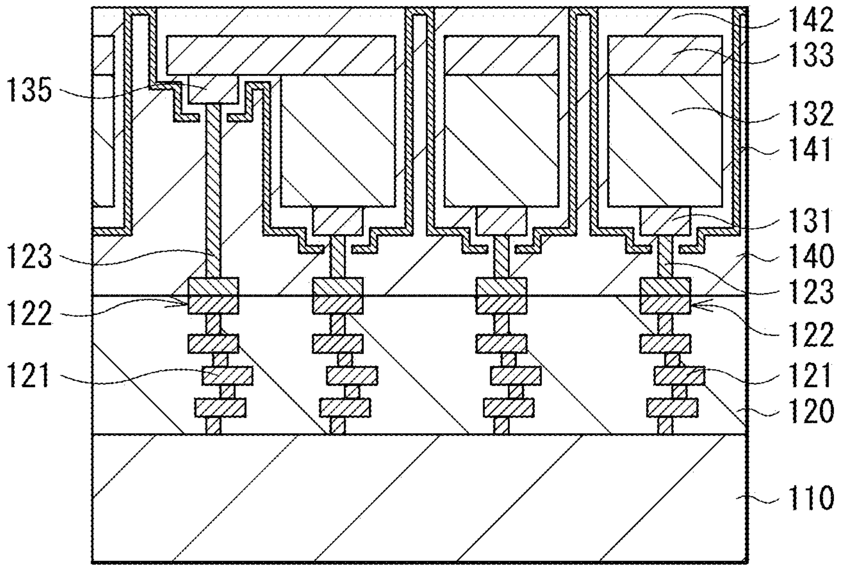
FIG. 3S is a vertical cross-sectional view of one process included in the method of manufacturing the light-emitting device according to the embodiment.

Thereafter, as illustrated in FIG. 3S, the entire insulating layer 142 is etched to such an extent that a portion of the light-shielding section 141 is exposed. This makes it possible to further shorten a distance from a light emission surface to the light-emitting element 132 in the light-emitting device 1, thereby further enhancing efficiency of extracting light from the light-emitting element 132.

Figure 3T:
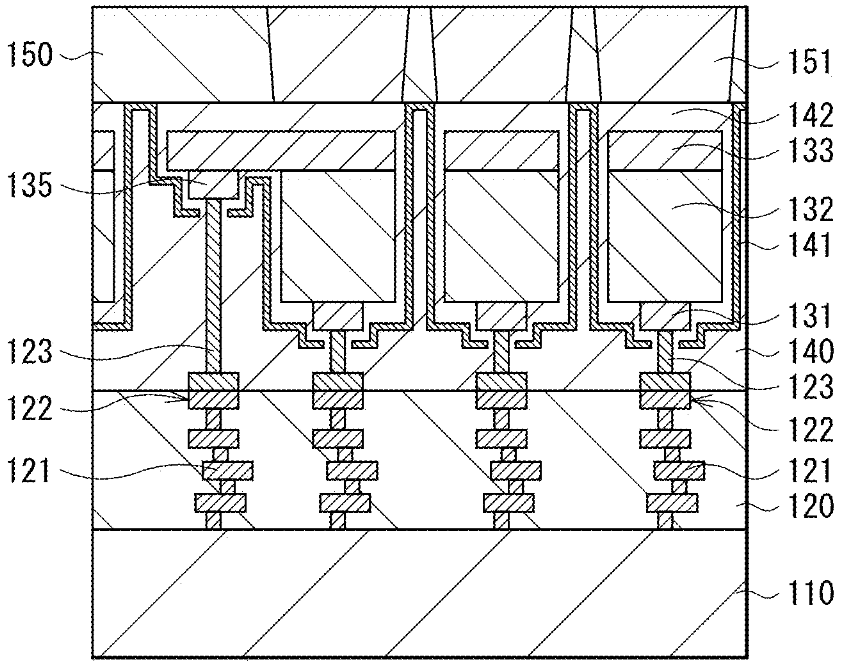
FIG. 3T is a vertical cross-sectional view of one process included in the method of manufacturing the light-emitting device according to the embodiment.
Figure 3U:
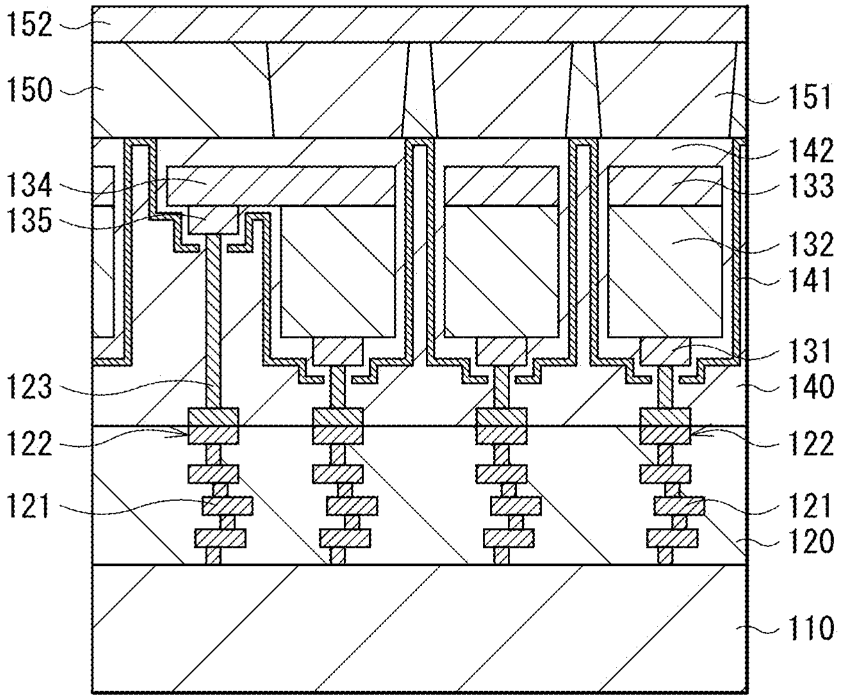
FIG. 3U is a vertical cross-sectional view of one process included in the method of manufacturing the light-emitting device according to the embodiment.

Thereafter, as illustrated in FIG. 3T, the fluorescent layer 151 and the pixel separation layer 150 are formed on the top of the insulating layer 142. The fluorescent layer 151 may include, for example, quantum dots or the like, and the pixel separation layer 150 may include, for example, Al or the like.

Thereafter, as illustrated in FIG. 3U, a film of a light-transmissive insulating material such as $SiO_x$, $SiN_x$, SiON, or $Al_2O_3$ is formed on the fluorescent layer 151 and the pixel separation layer 150 to thereby form the protective layer 152.

The light-emitting device 1 according to the present embodiment may thus be manufactured by the above processes.

(1.4. Modification Examples)

Subsequently, referring to FIGS. 4 to 9, first to sixth modification examples of the light-emitting device 1 according to the present embodiment will be described.

First Modification Example

Figure 4:
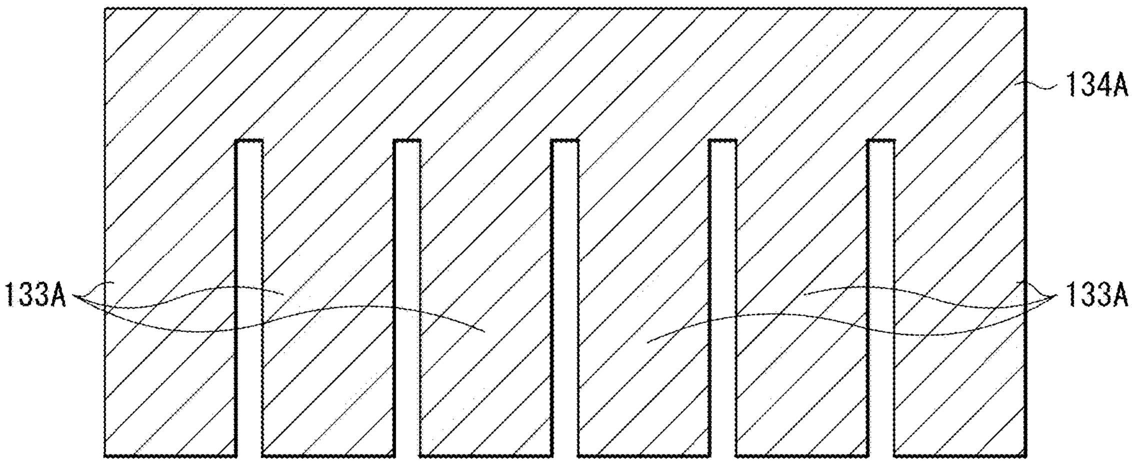
FIG. 4 is a plan view of a planar shape of common electrodes and an electrode coupler included in a light-emitting device according to a first modification example of the embodiment.

FIG. 4 is a plan view of a planar shape of common electrodes 133A and an electrode coupler 134A included in a light-emitting device according to a first modification example. For example, as illustrated in FIG. 4, the electrode coupler 134 may electrically couple six common electrodes 133 to each other.

In other words, the number of common electrodes 133 that the electrode coupler 134 electrically couples is not limited to three as illustrated in FIG. 2. The number is not particularly limited as long as the electrode coupler 134 electrically couples a plurality of common electrodes 133.

Second Modification Example

Figure 5:
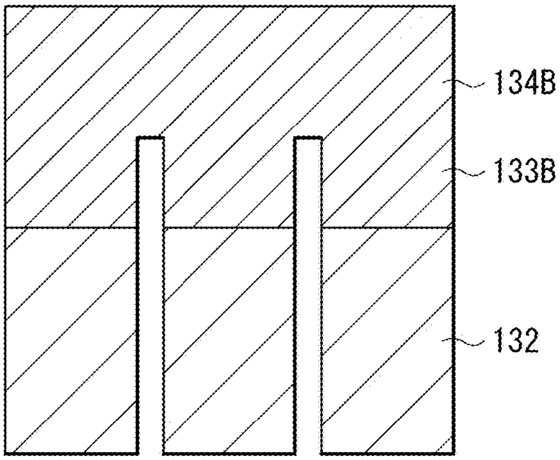
FIG. 5 is a plan view of a planar shape of a common electrode and an electrode coupler included in a light-emitting device according to a second modification example of the embodiment.

FIG. 5 is a plan view illustrating a planar shape of a common electrode 133B and an electrode coupler 134B of a light-emitting device according to a second modification example. For example, as illustrated in FIG. 5, the common electrode 133B may not cover an entire second surface of the light-emitting element 132. In other words, the common electrode 133B may apply an electric field to the light-emitting element 132 at a portion of the second surface of the light-emitting element 132.

Third Modification Example

Figure 6:
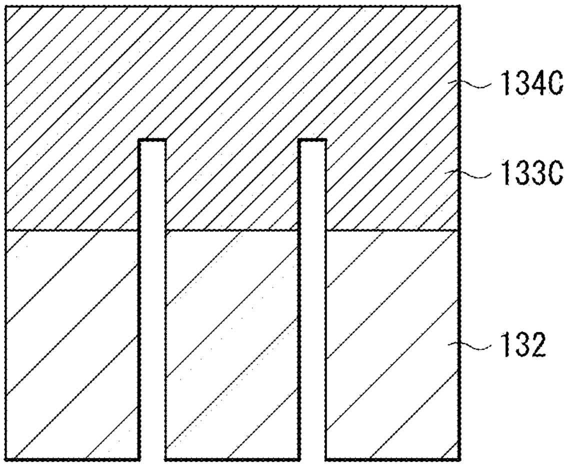
FIG. 6 is a plan view of a planar shape of a common electrode and an electrode coupler included in a light-emitting device according to a third modification example of the embodiment.

FIG. 6 is a plan view illustrating a planar shape of a common electrode 133C and an electrode coupler 134C of a light-emitting device according to a third modification example. For example, as illustrated in FIG. 6, in a case where the common electrode 133C does not cover the entire second surface of the light-emitting element 132, the common electrode 133C and the electrode coupler 134C may include a metal material such as Pd, Ti, TiN, W, Al, Cu, Pt, Ag, Ni, or Au other than the transparent electrically conductive material. In such a case, the light-emitting element 132 is able to emit light from the second surface that is not covered with the common electrode 133.

Fourth Modification Example

Figure 7:
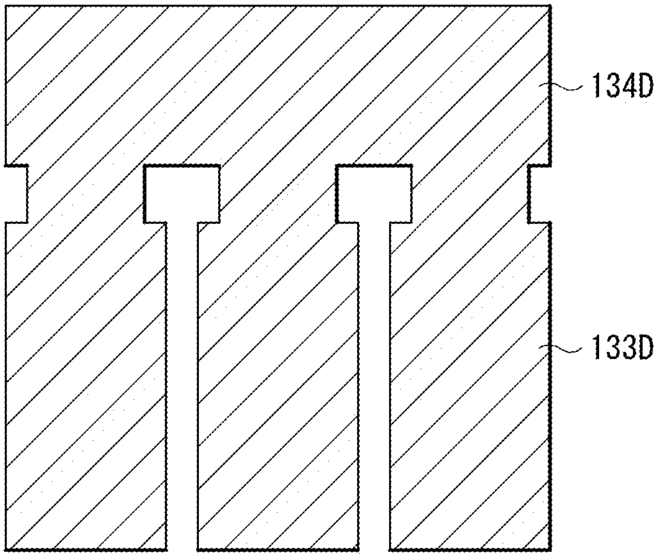
FIG. 7 is a plan view of a planar shape of a common electrode and an electrode coupler included in a light-emitting device according to a fourth modification example of the embodiment.

FIG. 7 is a plan view illustrating a planar shape of a common electrode 133D and an electrode coupler 134D of a light-emitting device according to a fourth modification example. For example, as illustrated in FIG. 7, a coupling section between the common electrode 133D and the electrode coupler 134D may be shaped. More specifically, the coupling section between the common electrode 133D and the electrode coupler 134D may be formed in a constricted planar shape in order to further narrow the propagation path of light. According to this, the common electrode 133D and the electrode coupler 134D is able to further suppress the light leakage between the pixels through the electrode coupler 134D.

Fifth Modification Example

Figure 8:
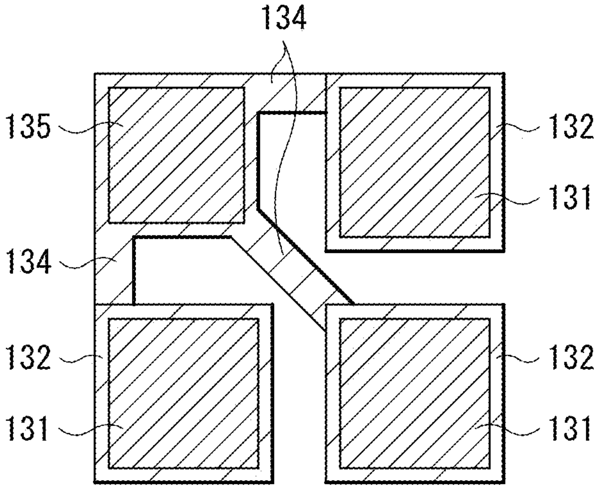
FIG. 8 is a top view in which a pixel electrode, a light-emitting element, a common electrode, an electrode coupler, and a contact section included in a light-emitting device according to a fifth modification example of the embodiment are extracted.

FIG. 8 is a top view in which the pixel electrode 131, the light-emitting element 132, the common electrode 133, the electrode coupler 134, and the contact section 135 included in a light-emitting device according to a fifth modification example are extracted. As illustrated in FIG. 8, the pixels each including the pixel electrode 131 and the light-emitting element 132, and the electrode couplers 134 each electrically coupling the common electrodes 133 of the respective pixels may be disposed in a matrix. In other words, the pixels each including the pixel electrode 131 and the light-emitting element 132 may be provided in any arrangement, and the electrode couplers 134 each electrically coupling the common electrodes 133 of the respective pixels may be provided in any shape. It is to be noted that the pixels each including the pixel electrode 131 and the light-emitting element 132 may be provided in a delta-arrangement which is an arrangement of vertices of an equilateral triangle.

Sixth Modification Example

Figure 9:
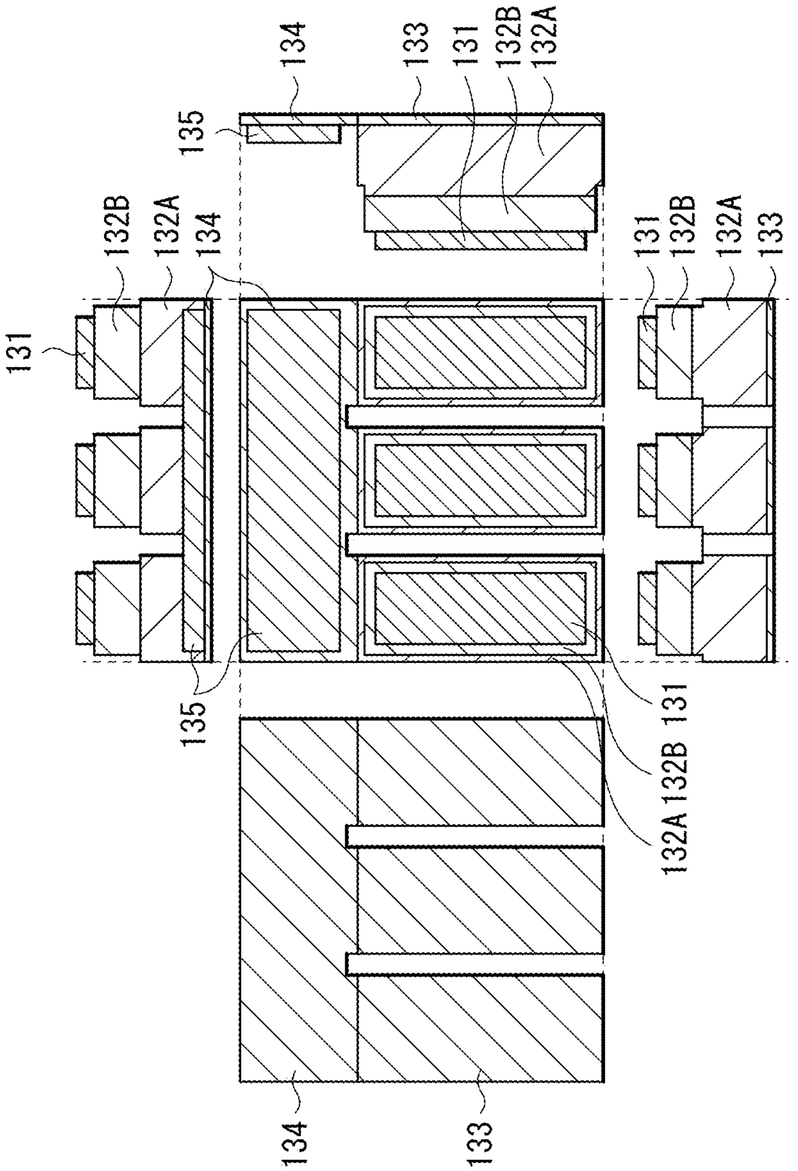
FIG. 9 is an orthographic view in which a pixel electrode, a light-emitting element, common electrode, an electrode coupler, and a contact section according to a sixth modification example of the embodiment are extracted.

FIG. 9 is an orthographic view in which the pixel electrode 131, the light-emitting element 132 (the second light-emitting element 132B and the first light-emitting element 132A), the common electrode 133, the electrode coupler 134, and the contact section 135 according to a sixth modification example are extracted. As illustrated in FIG. 9, a stacked structure of the light-emitting element 132 may be reversed from stacked structure illustrated in FIG. 2. Specifically, the light-emitting element 132 may be configured by: the first light-emitting element 132A in which p-GaN, p-AlGaN, and the multi-quantum-well structure (MQWs) are stacked in this order from a side of the common electrode 133; and the second light-emitting element 132B in which n-GaN, and u-GaN are stacked.

2. Second Embodiment (2.1. Overall Configuration)

Figure 10:
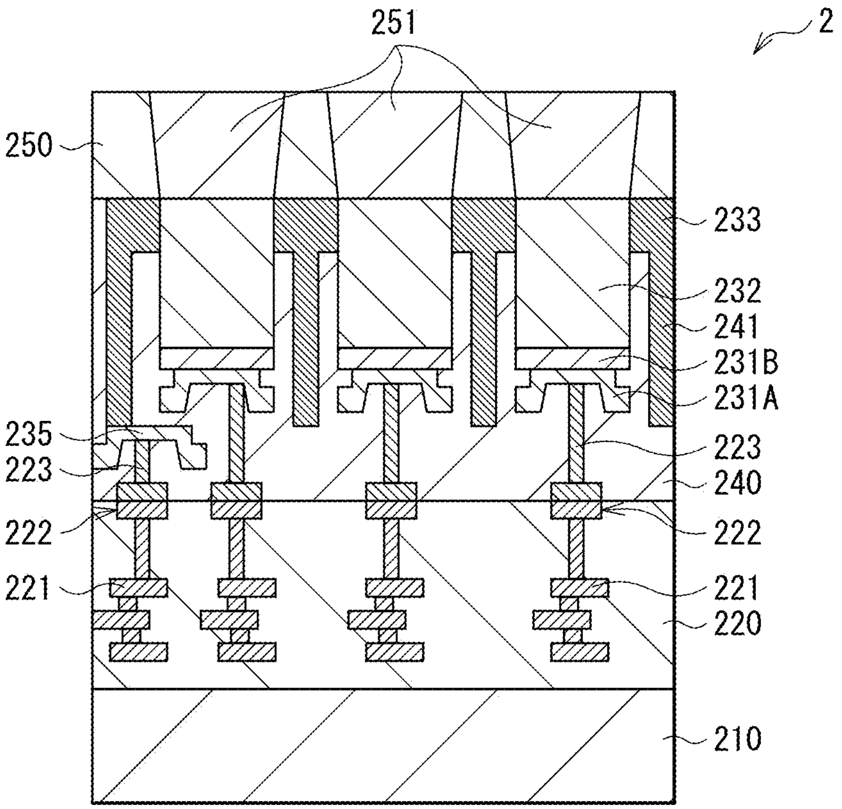
FIG. 10 is a vertical cross-sectional view of an overall configuration of a light-emitting device according to a second embodiment of the present disclosure.

Subsequently, referring to FIG. 10, an overall configuration of a light-emitting device according to a second embodiment of the present disclosure will be described. FIG. 10 is a vertical cross-sectional view of the overall configuration of the light-emitting device according to the present embodiment.

As illustrated in FIG. 10, a light-emitting device 2 according to the present embodiment includes, for example, a light-emitting element 232, a first pixel electrode 231A and a second pixel electrode 231B (also referred to as a pixel electrode 231, both inclusive), a common electrode 233, an electrode coupler 241, a contact section 235, an insulating layer 240, a fluorescent layer 251, a pixel separation layer 250, a through via 223, a metal junction 222, a multilayer wiring layer 221, an interlayer insulating layer 220, and a drive substrate 210.

The light-emitting element 232, the contact section 235, the insulating layer 240, the fluorescent layer 251, the pixel separation layer 250, the through via 223, the metal junction 222, the multilayer wiring layer 221, the interlayer insulating layer 220, and the drive substrate 210 are respectively substantially similar to the light-emitting element 132, the contact section 135, the insulating layer 140, the fluorescent layer 151, the pixel separation layer 150, the through via 123, the metal junction 122, the multilayer wiring layer 121, the interlayer insulating layer 120, and the drive substrate 110 described in the light-emitting device 1 according to the first embodiment.

Figure 11:
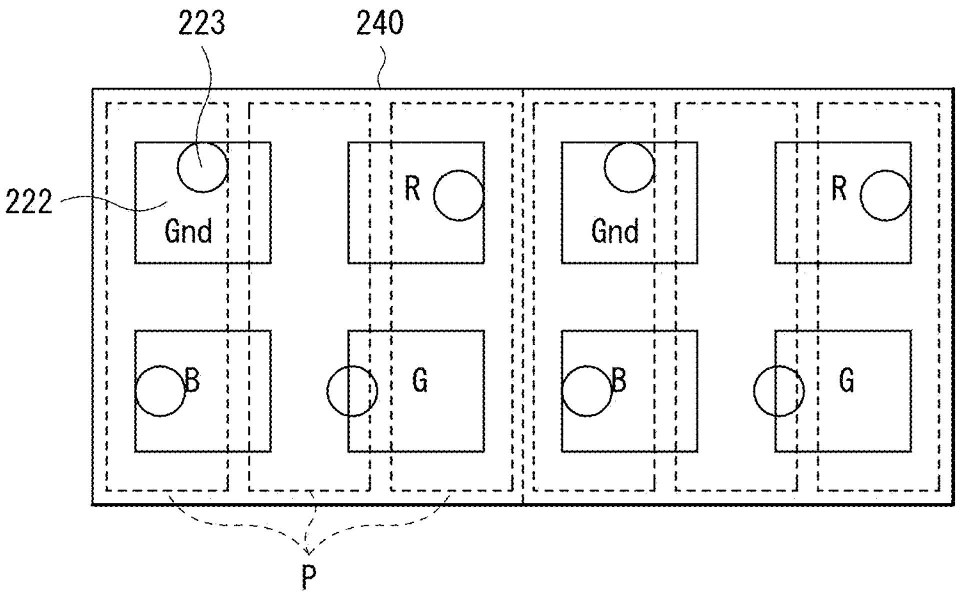
FIG. 11 is a plan view of a planar positional relationship of a through via and a metal junction versus each pixel.

It is to be noted that a planar positional relationship of the through via 223 and the metal junction 222 versus each pixel P is illustrated in FIG. 11. FIG. 11 is a plan view of the planar positional relationship of the through via 223 and the metal junction 222 versus each pixel P.

As illustrated in FIG. 11, the pixels P may be arranged in one direction in a rectangular shape, and each pixel may serve as, for example, a red pixel (R), a green pixel (G), or a blue pixel (B). Further, the through vias 223 electrically coupled to the pixel electrodes 231 of the red pixel (R), the green pixel (G), and the blue pixel (B) may be disposed in such a manner as to be electrically coupled to the metal junctions 222 disposed in a matrix in regions each provided with the red pixel (R), the green pixel (G), or the blue pixel (B). The through vias 223 electrically coupled to the contact section 235 may likewise be disposed in a such a manner as to be electrically coupled to the metal junctions 222 disposed in the matrix. This allows the light-emitting device 2 to dispose the through vias 223 and the metal junctions 222 more efficiently.

The first pixel electrode 231A and the second pixel electrode 231B configure a pixel electrode that is able to apply independent potential for each pixel, and are provided for each pixel on a first surface side (i.e., on a lower side in FIG. 10) of the light-emitting element 232. For example, the first pixel electrode 231A may include a metal material such as Pd, Ti, TiN, W, Al, Cu, Pt, Ag, Ni, or Au, and the second pixel electrode 231B may include a transparent electrically conductive material such as ITO, IZO, ZnO, SnO, or TiO.

The common electrode 233 is an electrode that is able to apply common potential to a plurality of pixels, and is electrically coupled to a side surface of an uppermost layer on a second surface side (i.e., on an upper side in FIG. 10) of the light-emitting element 232, the second surface side being opposite to the first surface side. For example, the common electrode 233 may have a single-layer structure or a multiple-layer stacked structure including a metal material such as Pd, Ti, TiN, W, Al, Cu, Pt, Ag, Ni, or Au. The common electrodes 233 of the respective pixels are electrically coupled to each other by the electrode coupler 241, which makes it possible to apply common potential to the plurality of pixels.

The electrode coupler 241 is provided in such a manner as to surround the light-emitting element 232 of each pixel with a metal material such as W, Ti, TiN, Cu, Al, or Ni. The electrode coupler 241 is electrically coupled to the common electrode 233 of each pixel and to the electrode coupler 241 surrounding the adjacent pixel, which makes it possible to electrically couple the common electrodes 233 of the respective pixels to each other.

Further, the electrode coupler 241 may have a height extending from the common electrode 233 to the first pixel electrode 231A, and may be provided to surround the periphery of the light-emitting element 232 of each pixel. According to this, the electrode coupler 241 is able to shield light between the light-emitting elements 232 of the respective pixels. In such a case, the electrode coupler 241 is also able to have a function of the light-shielding section 141 included in the light-emitting device 1 according to the first embodiment. The electrode coupler 241 will be described in detail later by referring to FIGS. 12A and 12B.

(2.2. Detailed Configuration)

Figure 12A:
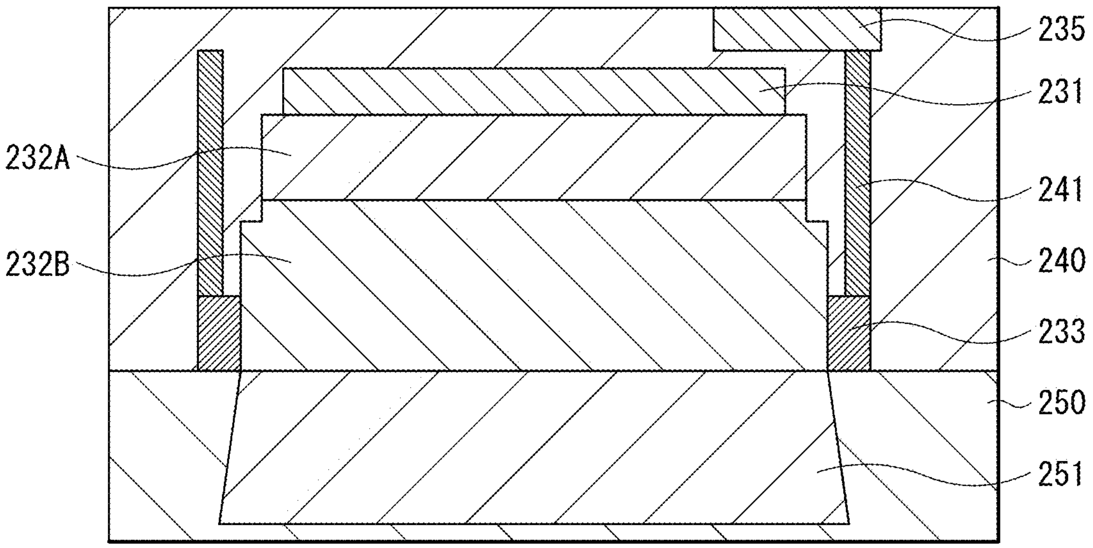
FIG. 12A is a vertical cross-sectional view in which a pixel electrode, a light-emitting element, a common electrode, an electrode coupler, and a contact section are extracted.
Figure 12B:
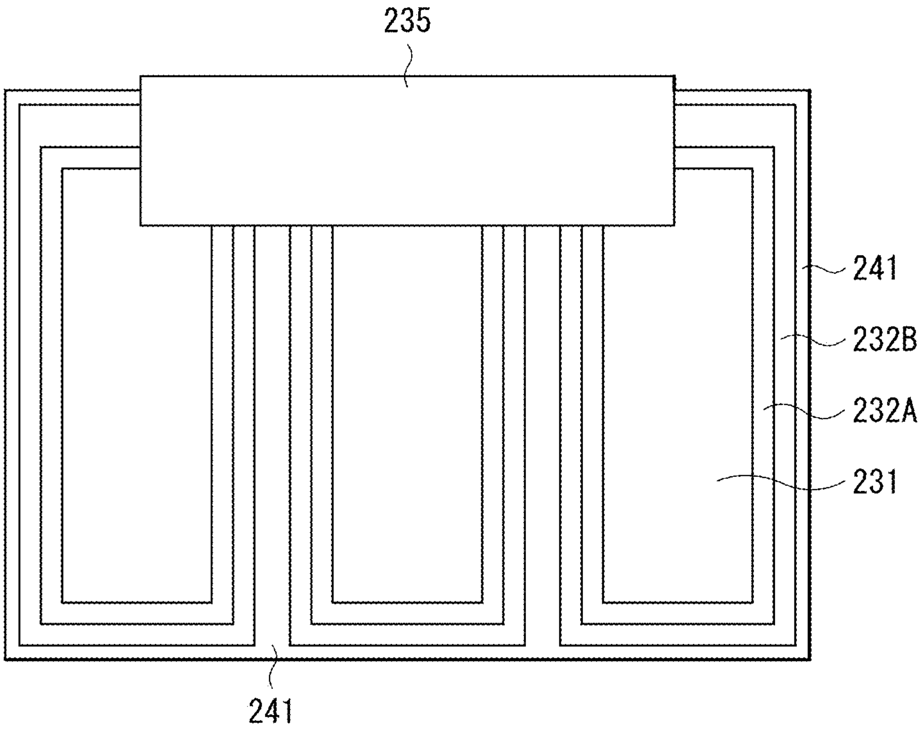
FIG. 12B is a top view in which the pixel electrode, the light-emitting element, the common electrode, the electrode coupler, and the contact section are extracted.

Next, referring to FIGS. 12A and 12B, the detailed configuration of the light-emitting device 2 according to the present embodiment will be described. FIG. 12A is a vertical cross-sectional view in which the pixel electrode 231, the light-emitting element 232, the common electrode 233, the electrode coupler 241, and the contact section 235 are extracted. FIG. 12B is a top view in which the pixel electrode 231, the light-emitting element 232, the common electrode 233, the electrode coupler 241, and the contact section 235 are extracted.

As illustrated in FIGS. 12A and 12B, the second light-emitting element 232B, the first light-emitting element 232A, and the pixel electrode 231 are stacked in order. The first light-emitting element 232A corresponds, for example, to a stacked structure of p-GaN, p-AlGaN, and the multi-quantum-well structure (MQWs), and the second light-emitting element 232B corresponds, for example, to a stacked structure of n-GaN and u-GaN. The first light-emitting element 232A and the second light-emitting element 232B configure the light-emitting element 232. The common electrode 233 is provided to a side surface of u-GaN that is a lowermost layer of the second light-emitting element 232B.

The second light-emitting element 232B, the first light-emitting element 232A, and the pixel electrode 231 each have an island shape, and the island shape is provided separately for each pixel. The electrode coupler 241 is provided in such a manner as to surround the second light-emitting element 232B, the first light-emitting element 232A, and the pixel electrode 231. The electrode coupler 241 is electrically coupled to the common electrode 233 provided on the side surface of the lowermost layer of the second light-emitting element 232B, and is electrically coupled to the electrode coupler 241 is provided in such a manner as to surround the light-emitting element 232 of each pixel. According to this, the electrode coupler 241 is able to electrically couple the common electrodes 233 of the respective pixels to each other. It is to be noted that the electrode coupler 241 is provided in such a manner as to be electrically separated from the first light-emitting element 232A and the second light-emitting element 232B.

Further, the electrode coupler 241 includes a metal material having a light shielding property, and has a height greater than a height of the stack of the second light-emitting element 232B, the first light-emitting element 232A, and the pixel electrode 231. It is thus possible to suppress light leakage from occurring between the light-emitting elements 232 of the respective pixels.

In addition, the contact section 235 is provided on the electrode coupler 241 to be an electric contact with the common electrode 233. This enables the contact section 235 to be electrically coupled by the through via 223 from the same side as the side on which the pixel electrode 231 is present. The contact section 235 may have a single-layer structure or a multiple-layer stacked structure including a metal material such as Pd, Ti, TiN, W, Al, Cu, Pt, Ag, Ni, or Au.

The light-emitting device 2 according to the present embodiment includes the common electrode 233 provided on a side surface of the light-emitting element 232, and is therefore able to further increase a light-emission area ratio in the light-emitting element 232. Further, in the light-emitting device 2, the light-emitting elements 232 is provided in the island-shaped structure separately for each pixel, and the electrode coupler 241 that also functions as the light-shielding section surrounds the periphery of the light-emitting element 232 of each pixel. According to this, the light-emitting device 2 is able to suppress the light leakage between the pixels.

(2.3. Manufacturing Method)

Figure 13A:
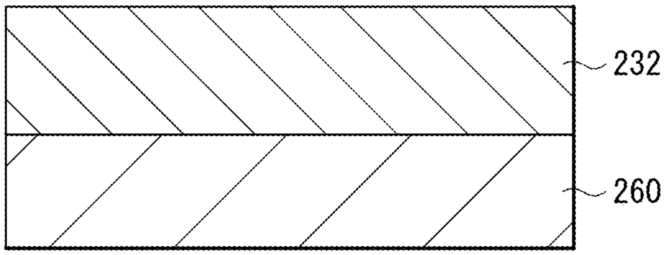
FIG. 13A is a vertical cross-sectional view of one process included in a method of manufacturing the light-emitting device according to the embodiment.

Next, referring to FIGS. 13A to 13V, a method of manufacturing the light-emitting device 2 according to the present embodiment will be described. FIGS. 13A to 13V are each a vertical cross-sectional view of one process included in the method of manufacturing the light-emitting device 2 according to the present embodiment.

First, as illustrated in FIG. 13A, the light-emitting element 232 is formed by epitaxially growing the group III-V compound semiconductor on a crystal growth substrate 260 including Si, sapphire, or the like. The light-emitting element 232 may be formed by sequentially stacking the group III-V compound semiconductors in the order of, for example, u-GaN, n-GaN, the multi-quantum-well structure (MQWs), p-AlGaN, and p-GaN.

Figure 13B:
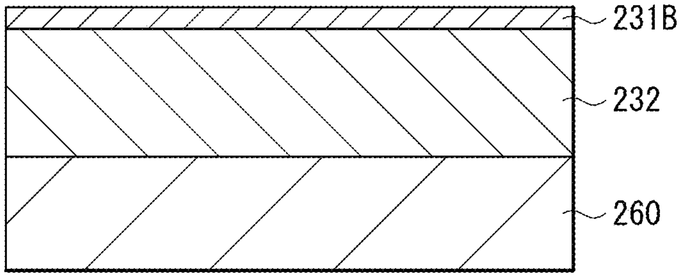
FIG. 13B is a vertical cross-sectional view of one process included in the method of manufacturing the light-emitting device according to the embodiment.

Thereafter, as illustrated in FIG. 13B, a film of a transparent electrically conductive material such as ITO is formed on the light-emitting element 232 to thereby form the second pixel electrode 231B.

Figure 13C:
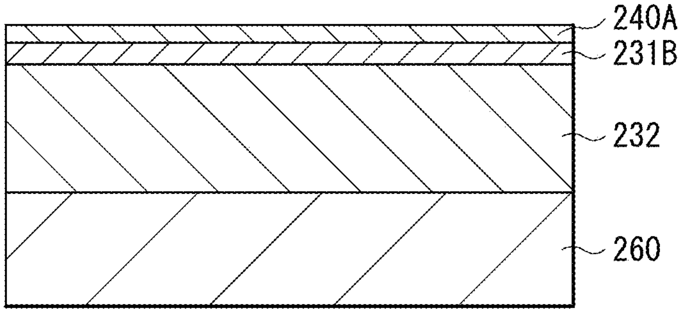
FIG. 13C is a vertical cross-sectional view of one process included in the method of manufacturing the light-emitting device according to the embodiment.

Thereafter, as illustrated in FIG. 13C, a film of $SiO_x$ or the like is formed on the second pixel electrode 231B to thereby form an oxide film 240A. The oxide film 240A is provided, for example, to bond a support substrate 261 to the light-emitting element 232 in a process of a subsequent stage.

Figure 13D:
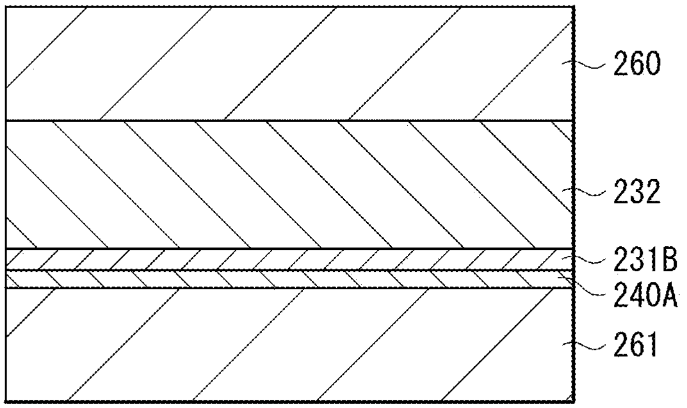
FIG. 13D is a vertical cross-sectional view of one process included in the method of manufacturing the light-emitting device according to the embodiment.

Thereafter, as illustrated in FIG. 13D, the support substrate 261 is bonded to the oxide film 240A. As the support substrate 261, for example, a Si substrate or the like may be used. It is to be noted that FIG. 13D is flipped vertically with respect to FIG. 13C.

Figure 13E:
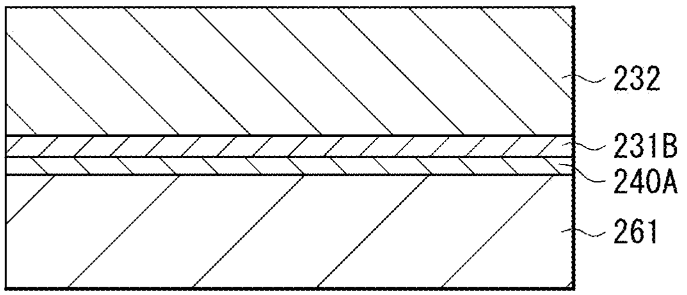
FIG. 13E is a vertical cross-sectional view of one process included in the method of manufacturing the light-emitting device according to the embodiment.

Thereafter, as illustrated in FIG. 13E, the crystal growth substrate 260 is removed from the light-emitting element 232. Specifically, the crystal growth substrate 260 may be removed from the light-emitting element 232 by grinding with a grinder, wet etching, or the like. The crystal growth substrate 260 may also be removed from the light-emitting element 232 by CMP (Chemical Mechanical Polishing), dry etching, or the like.

Figure 13F:
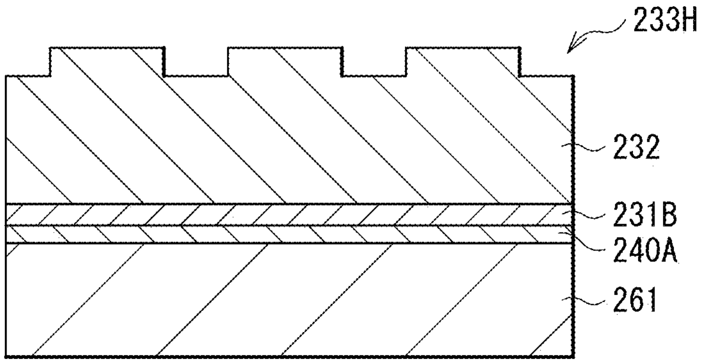
FIG. 13F is a vertical cross-sectional view of one process included in the method of manufacturing the light-emitting device according to the embodiment.

Thereafter, as illustrated in FIG. 13F, the light-emitting element 232 is patterned using lithography and etching to thereby form an opening 233H in the light-emitting element 232. The opening 233H is provided to form the common electrode 233 in a process of a subsequent stage.

Figure 13G:
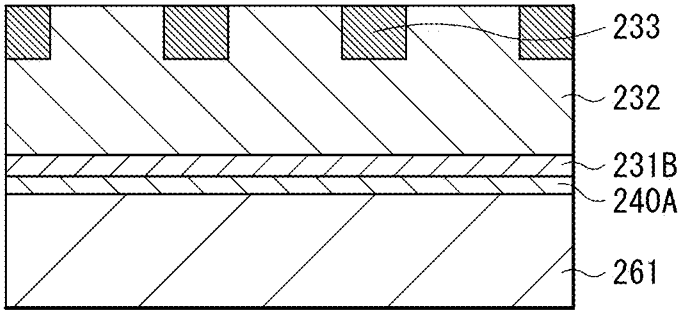
FIG. 13G is a vertical cross-sectional view of one process included in the method of manufacturing the light-emitting device according to the embodiment.

Thereafter, as illustrated in FIG. 13G, a film of a metal material such as Pd, Ti, TiN, W, Al, Cu, Pt, Ag, Ni, or Au is formed in such a manner as to fill the opening 233H to thereby form the common electrode 233.

Figure 13H:
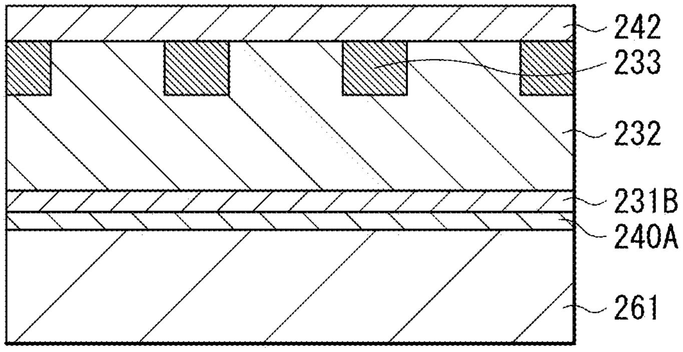
FIG. 13H is a vertical cross-sectional view of one process included in the method of manufacturing the light-emitting device according to the embodiment.

Thereafter, as illustrated in FIG. 13H, a film of $SiO_x$ or the like is formed on the light-emitting element 232 and the common electrode 233 to thereby form the insulating layer 242.

Figure 13I:
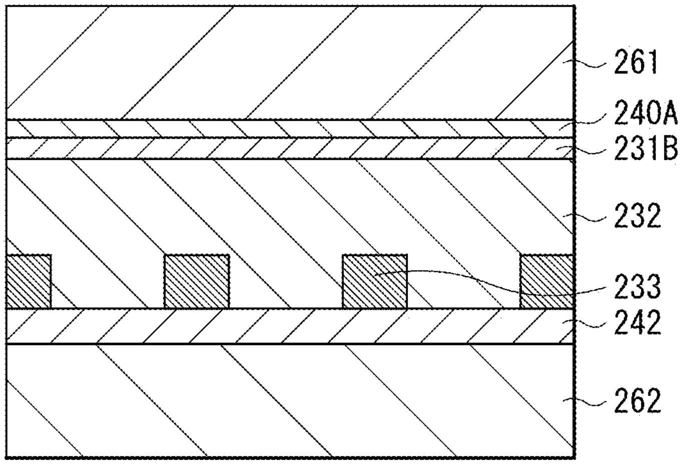
FIG. 13I is a vertical cross-sectional view of one process included in the method of manufacturing the light-emitting device according to the embodiment.

Thereafter, as illustrated in FIG. 13I, the support substrate 262 is bonded to the insulating layer 242. As the support substrate 262, for example, a Si substrate or the like may be used. It is to be noted that FIG. 13I is flipped vertically with respect to FIG. 13H.

Figure 13J:
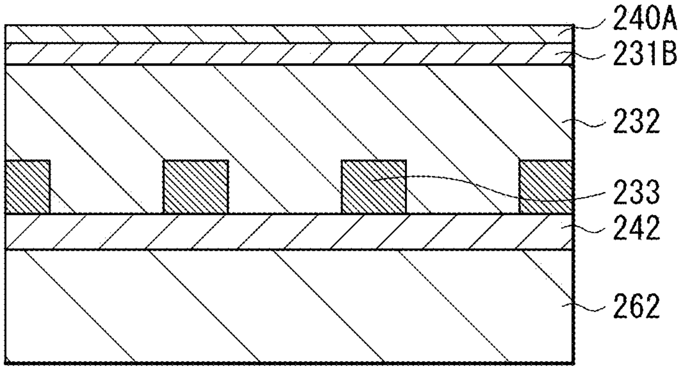
FIG. 13J is a vertical cross-sectional view of one process included in the method of manufacturing the light-emitting device according to the embodiment.

Thereafter, as illustrated in FIG. 13J, the support substrate 261 is removed from top of the oxide film 240A. For example, the support substrate 261 may be removed from the top of the oxide film 240A by grinding with a grinder, wet etching, or the like.

Figure 13K:
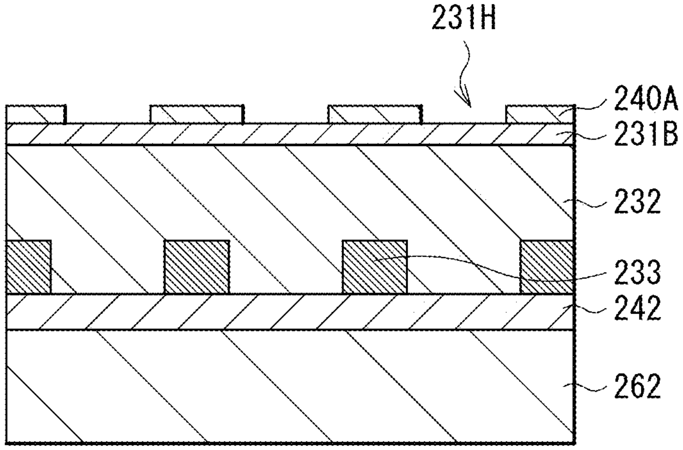
FIG. 13K is a vertical cross-sectional view of one process included in the method of manufacturing the light-emitting device according to the embodiment.

Thereafter, as illustrated in FIG. 13K, the oxide film 240A is patterned using lithography and etching to thereby form an opening 231H in the oxide film 240A. The opening 231H is provided to form the first pixel electrode 231A in a process of a subsequent stage.

Figure 13L:
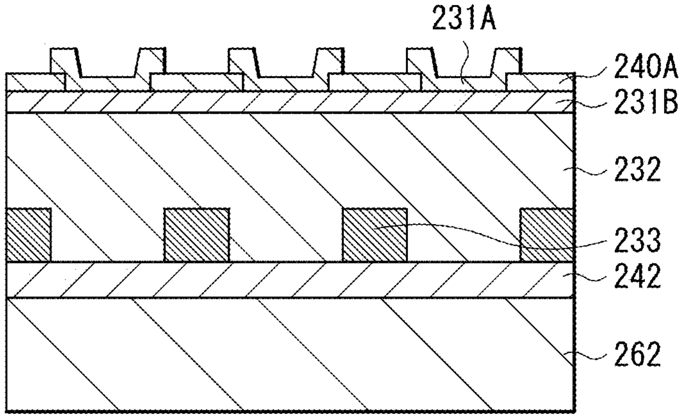
FIG. 13L is a vertical cross-sectional view of one process included in the method of manufacturing the light-emitting device according to the embodiment.

Thereafter, as illustrated in FIG. 13L, a film of a metal material such as Pd, Ti, TiN, W, Al, Cu, Pt, Ag, Ni, or Au is formed in such a manner as to fill the opening 231H to thereby form the first pixel electrode 231A.

Figure 13M:
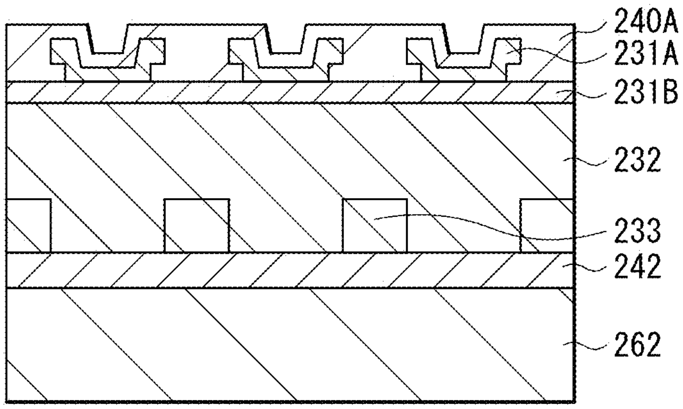
FIG. 13M is a vertical cross-sectional view of one process included in the method of manufacturing the light-emitting device according to the embodiment.

Thereafter, as illustrated in FIG. 13M, the oxide film 240A is further formed over the first pixel electrode 231A.

Figure 13N:
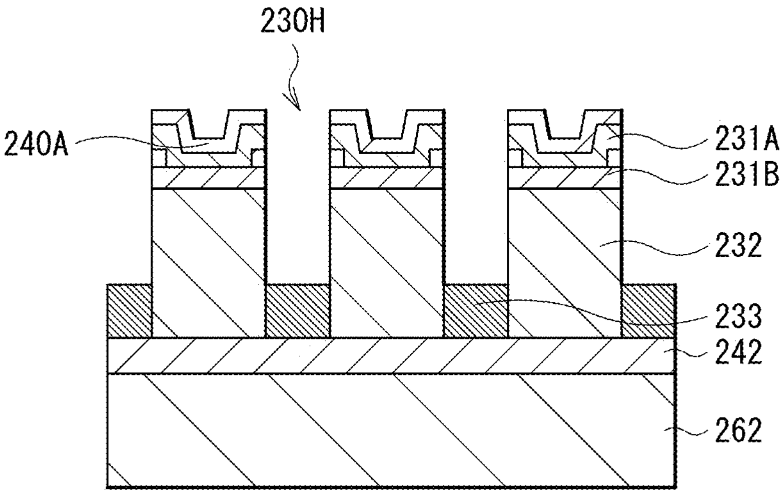
FIG. 13N is a vertical cross-sectional view of one process included in the method of manufacturing the light-emitting device according to the embodiment.

Thereafter, as illustrated in FIG. 13N, the oxide film 240A, the second pixel electrode 231B, and the light-emitting element 232 are patterned by lithography and etching to thereby form an opening 230H that separates the light-emitting elements 232 from each other for each pixel. At this time, the opening 230H is formed in such a manner as to expose the common electrode 233.

Figure 13O:
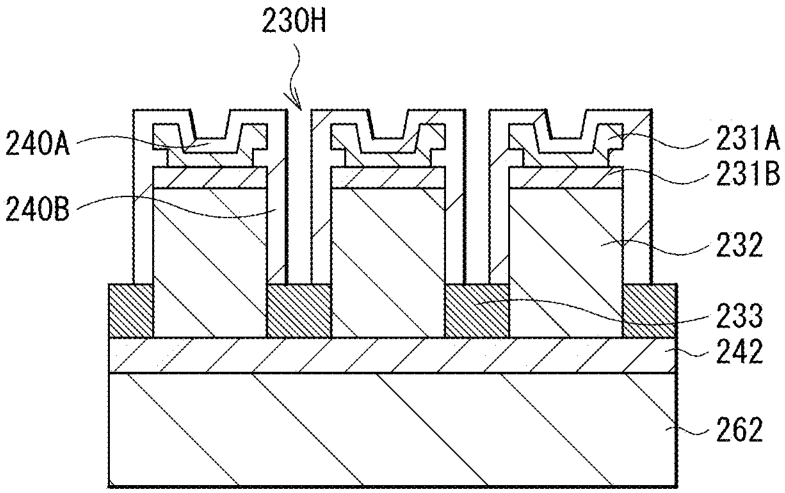
FIG. 13O is a vertical cross-sectional view of one process included in the method of manufacturing the light-emitting device according to the embodiment.

Thereafter, as illustrated in FIG. 13O, a film of $SiO_x$ or the like is formed on a side surface of an inside of the opening 230H to thereby form a side wall 240B. The side wall 240B is provided for electrically insulating the electrode coupler 241 formed inside the opening 230H and the light-emitting element 232.

Figure 13P:
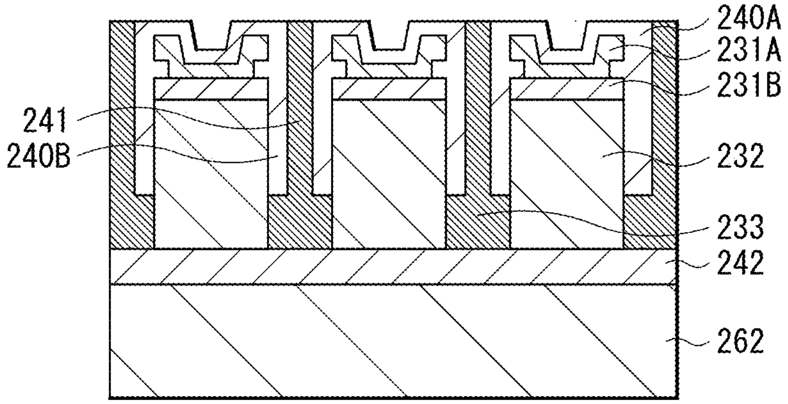
FIG. 13P is a vertical cross-sectional view of one process included in the method of manufacturing the light-emitting device according to the embodiment.

Thereafter, as illustrated in FIG. 13P, a film of a metal material having a light shielding property such as W, Ti, TiN, Cu, Al, or Ni is formed in such a manner as to fill the opening 230H to thereby form the electrode coupler 241.

Figure 13Q:
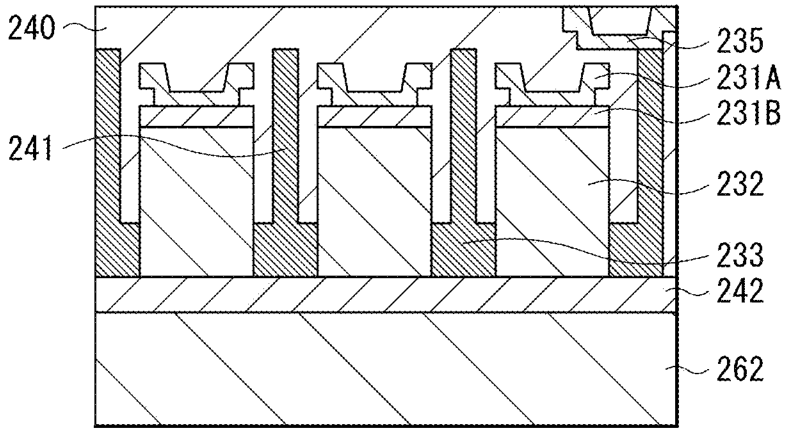
FIG. 13Q is a vertical cross-sectional view of one process included in the method of manufacturing the light-emitting device according to the embodiment.

Thereafter, as illustrated in FIG. 13Q, the insulating layer 240 is formed in such a manner as to fill the pixels. The insulating layer 240 is provided, for example, by forming a film of $SiO_x$ or the like using CVD (Chemical Vapor Deposition) or the like. Further, a film of a metal material such as Pd, Ti, TiN, W, Al, Cu, Pt, Ag, Ni, or Au is formed on the electrode coupler 241 to thereby form the contact section 235.

Figure 13R:
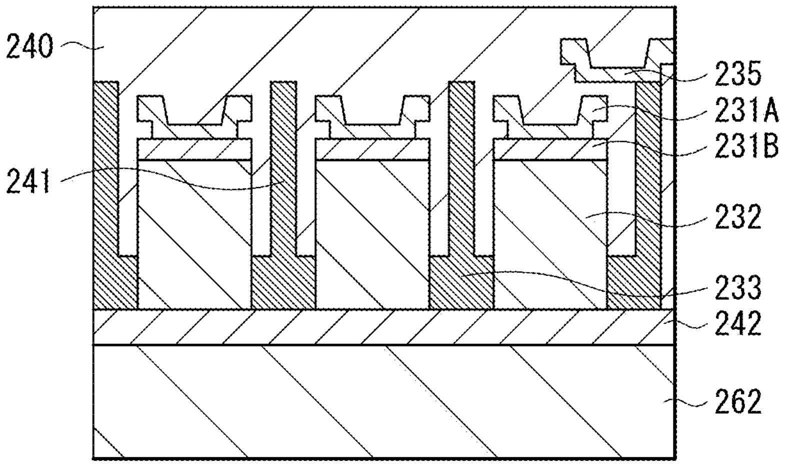
FIG. 13R is a vertical cross-sectional view of one process included in the method of manufacturing the light-emitting device according to the embodiment.

Thereafter, as illustrated in FIG. 13R, a film of the insulating layer 240 is further formed to planarize the surface. It is to be noted that the planarization of the surface of the insulating layer 240 may be performed by using CMP or etch-back.

Figure 13S:
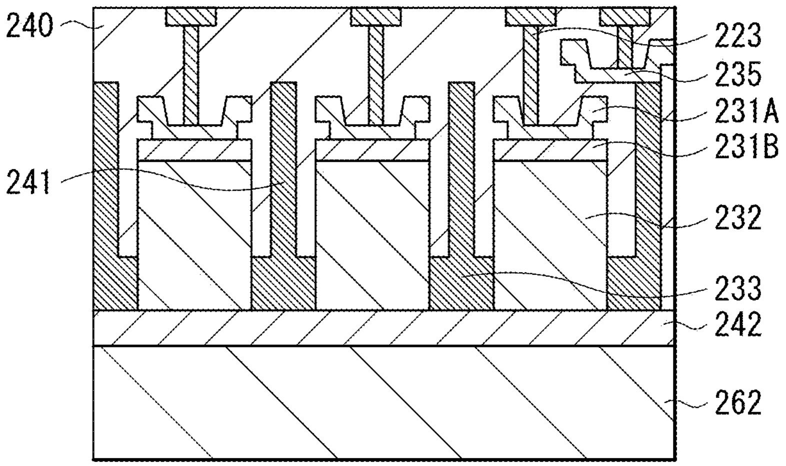
FIG. 13S is a vertical cross-sectional view of one process included in the method of manufacturing the light-emitting device according to the embodiment.

Thereafter, as illustrated in FIG. 13S, the through via 223 to be electrically coupled to the first pixel electrode 231A and the contact section 235 is formed. Specifically, the insulating layer 240 is patterned by lithography and etching to thereby form an opening in the insulating layer 240 in each of a region corresponding to the first pixel electrode 231A and a region corresponding to the contact section 235. A film of a metal material such as Pd, Ti, TiN, W, Al, Cu, Pt, Ag, Ni, or Au is formed in such a manner as to fill the formed opening to thereby form the through via 223. It is to be noted that an electrode to be the metal junction 222 is formed on the through via 223 in a process of a subsequent stage.

Figure 13T:
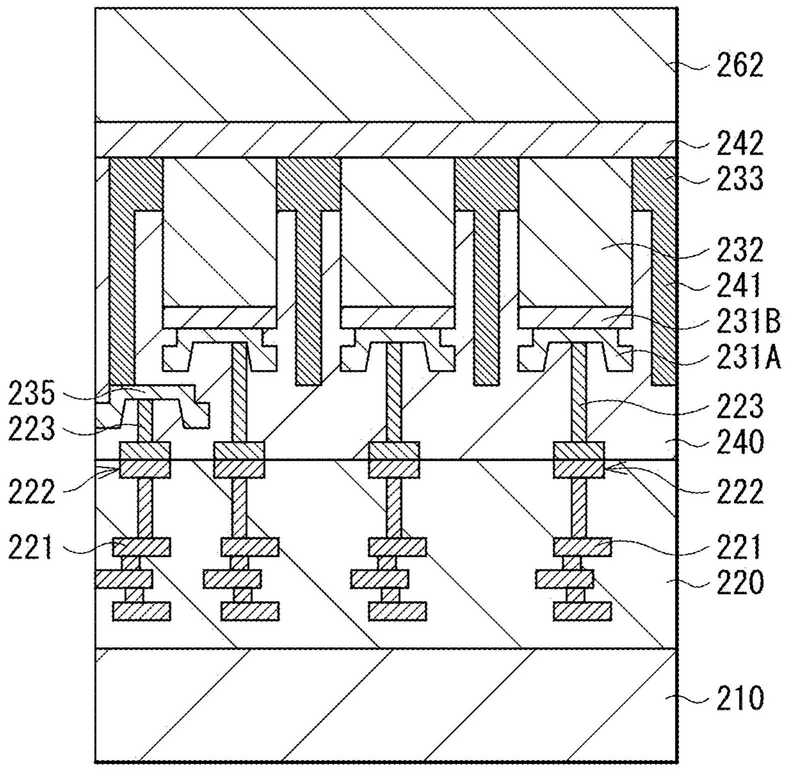
FIG. 13T is a vertical cross-sectional view of one process included in the method of manufacturing the light-emitting device according to the embodiment.

Thereafter, as illustrated in FIG. 13T, the drive substrate 210 on which the interlayer insulating layer 220 including the multilayer wiring layer 221 is stacked is attached to the stacked structure formed in the processes of FIGS. 13A to 13S. Specifically, the stacked structure formed in the processes of FIGS. 13A to 13S and the and the drive substrate 210 are attached to each other in such a manner that the insulating layer 240 and the interlayer insulating layer 220 are opposed to each other. Here, at the interface between the insulating layer 240 and the interlayer insulating layer 220, the electrodes exposed on the respective surfaces are bonded to each other to thereby form the metal junction 222. It is to be noted that FIG. 13T is flipped vertically with respect to FIG. 13S.

Figure 13U:
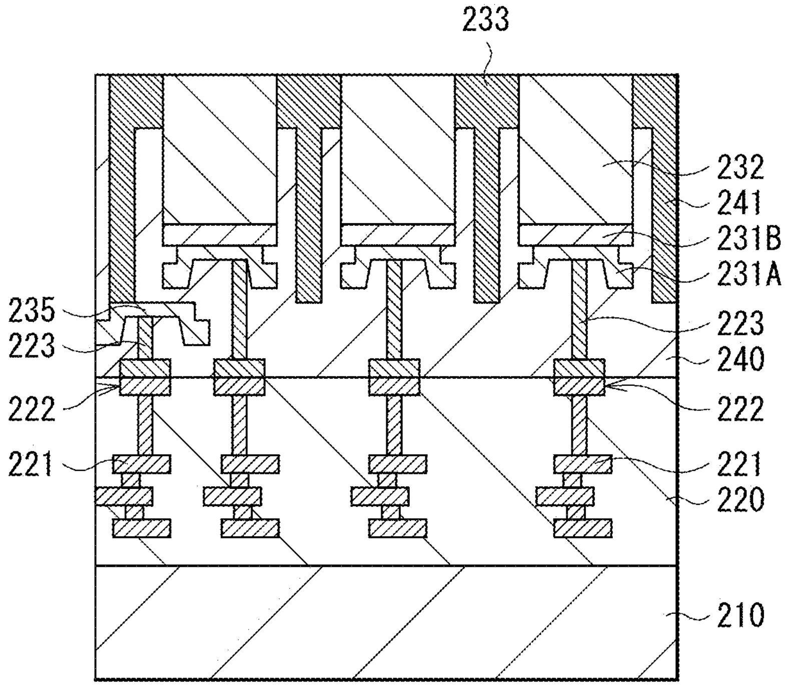
FIG. 13U is a vertical cross-sectional view of one process included in the method of manufacturing the light-emitting device according to the embodiment.
Figure 13V:
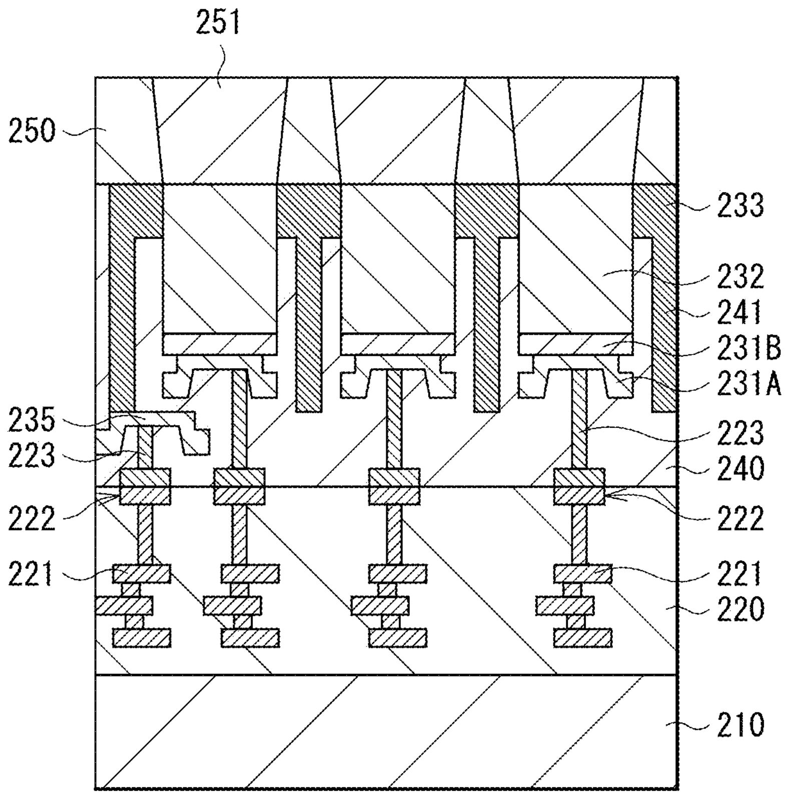
FIG. 13V is a vertical cross-sectional view of one process included in the method of manufacturing the light-emitting device according to the embodiment.

Thereafter, as illustrated in FIG. 13U, the support substrate 262 and the insulating layer 242 are removed from top of the light-emitting element 232 and top of the common electrode 233. For example, the support substrate 262 may be removed from the top of the light-emitting element 232 and the top of the common electrode 233 by grinding with a grinder, wet etching, or the like.

Thereafter, as illustrated in FIG. 13V, the fluorescent layer 251 and the pixel separation layer 250 are formed on the top of the light-emitting element 232 and the top of the common electrode 233. The fluorescent layer 251 may include, for example, quantum dots or the like, and the pixel separation layer 250 may include, for example, Al or the like.

The light-emitting device 2 according to the present embodiment may thus be manufactured by the above processes.

(2.4. Modification Examples)

Subsequently, referring to FIGS. 14 to 16, first to third modification examples of the light-emitting device 2 according to the present embodiment will be described.

First Modification Example

Figure 14:
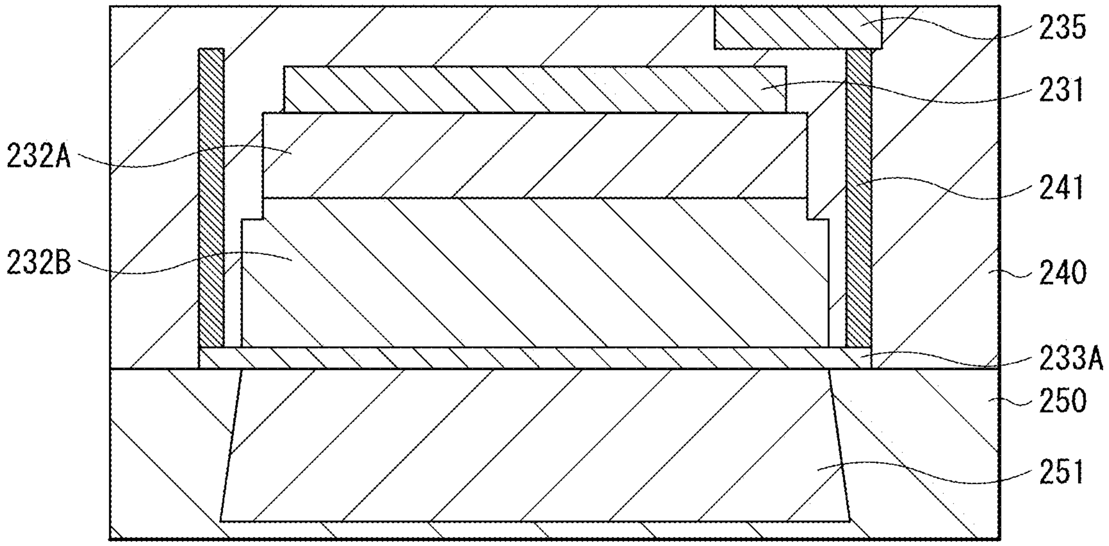
FIG. 14 is a vertical cross-sectional view in which a pixel electrode, a light-emitting element, a common electrode, an electrode coupler, and a contact section included in a light-emitting device according to a first modification example of the embodiment are extracted.

FIG. 14 is a vertical cross-sectional view in which the pixel electrode 231, the light-emitting element 232, a common electrode 233A, the electrode coupler 241, and the contact section 235 included in a light-emitting device according to a first modification example are extracted. For example, as illustrated in FIG. 14, the common electrode 233A may be provided as a transparent electrode on a surface of the second light-emitting element 232B. Specifically, the common electrode 233A may include a transparent electrically conductive material such as ITO, IZO, ZnO, SnO, or TiO and be provided in such a manner as to protrude from the second light-emitting element 232B to thereby be electrically coupled to the electrode coupler 241. According to this, it is possible to further simplify the processes of manufacturing the light-emitting device according to the first modification example.

Second Modification Example

Figure 15:
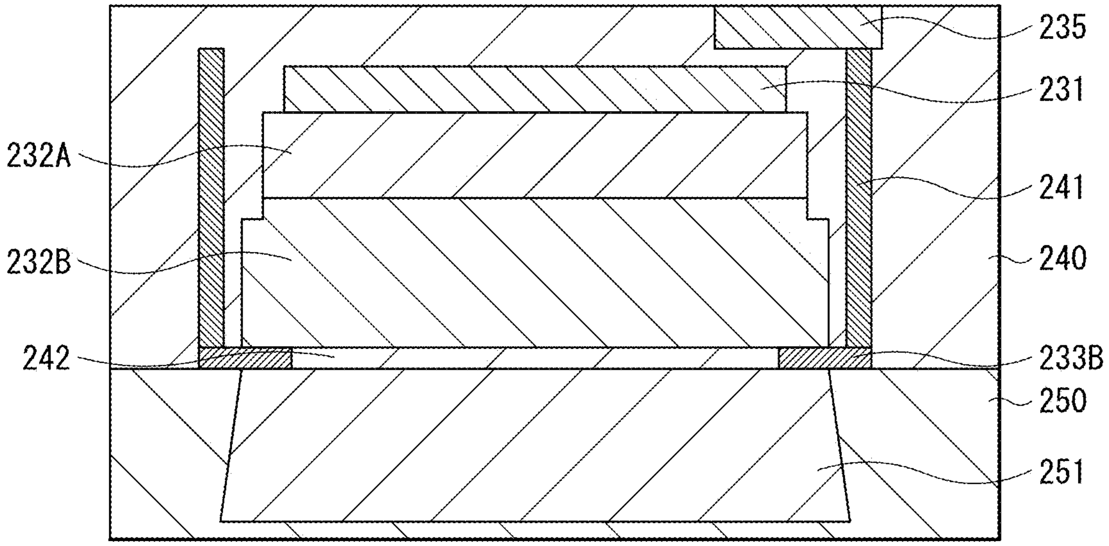
FIG. 15 is a vertical cross-sectional view in which a pixel electrode, a light-emitting element, a common electrode, an electrode coupler, and a contact section included in a light-emitting device according to a second modification example of the embodiment are extracted.

FIG. 15 is a vertical cross-sectional view in which the pixel electrode 231, the light-emitting element 232, a common electrode 233B, the electrode coupler 241, and the contact section 235 included in a light-emitting device according to a second modification example are extracted. For example, as illustrated in FIG. 15, the common electrode 233B may include a metal material such as W, Ti, TiN, Cu, Al, or Ni and may be provided on a portion of a region of the surface of the second light-emitting element 232B. In such a case, a region of the surface of the second light-emitting element 232B that is not provided with the common electrode 233B is covered with the transparent insulating layer 242. This makes it possible for the first light-emitting element 232A and the second light-emitting element 232B to ensure a light-emitting region. According to this, it is possible to further simplify the processes of manufacturing the light-emitting device according to the second modification example.

Third Modification Example

Figure 16:
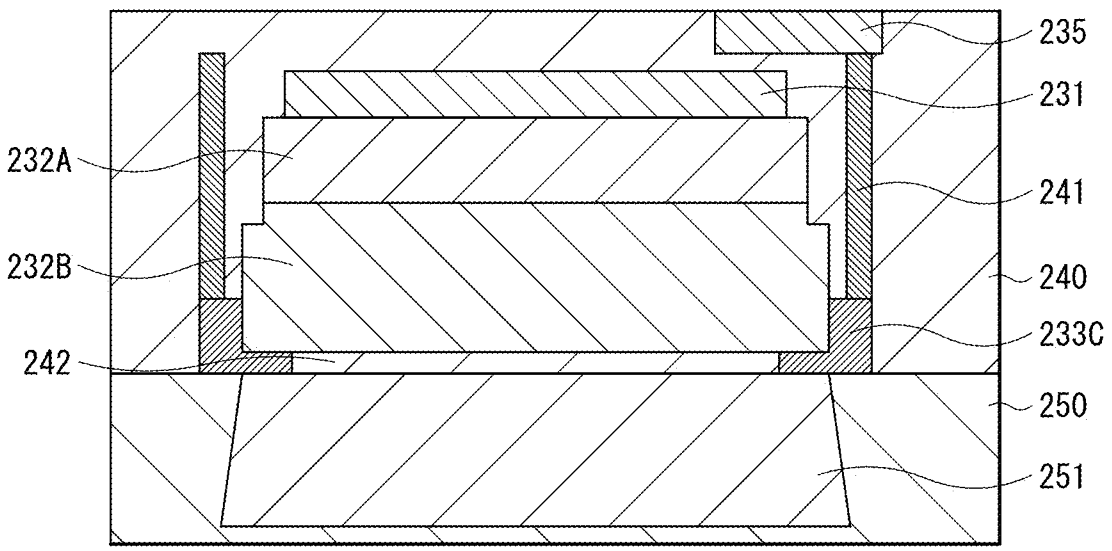
FIG. 16 is a vertical cross-sectional view in which a pixel electrode, a light-emitting element, a common electrode, an electrode coupler, and a contact section included in a light-emitting device according to a third modification example of the embodiment are extracted.

FIG. 16 is a vertical cross-sectional view in which the pixel electrode 231, the light-emitting element 232, a common electrode 233C, the electrode coupler 241, and the contact section 235 included in a light-emitting device according to a third modification example are extracted. For example, as illustrated in FIG. 16 the common electrode 233C may include a metal material such as W, Ti, TiN, Cu, Al, or Ni and may be provided on a portion of a region of the surface of the second light-emitting element 232B and on a side surface of the second light-emitting element 232B. In such a case, a region of the surface of the second light-emitting element 232B that is not provided with the common electrode 233C is covered with the transparent insulating layer 242. This makes it possible for the first light-emitting element 232A and the second light-emitting element 232B to ensure the light-emitting region. According to this, the light-emitting device according to the third modification example is able to further reduce contact resistance between the second light-emitting element 232B and the common electrode 233.

3. Third Embodiment (3.1. Overall Configuration)

Figure 17:
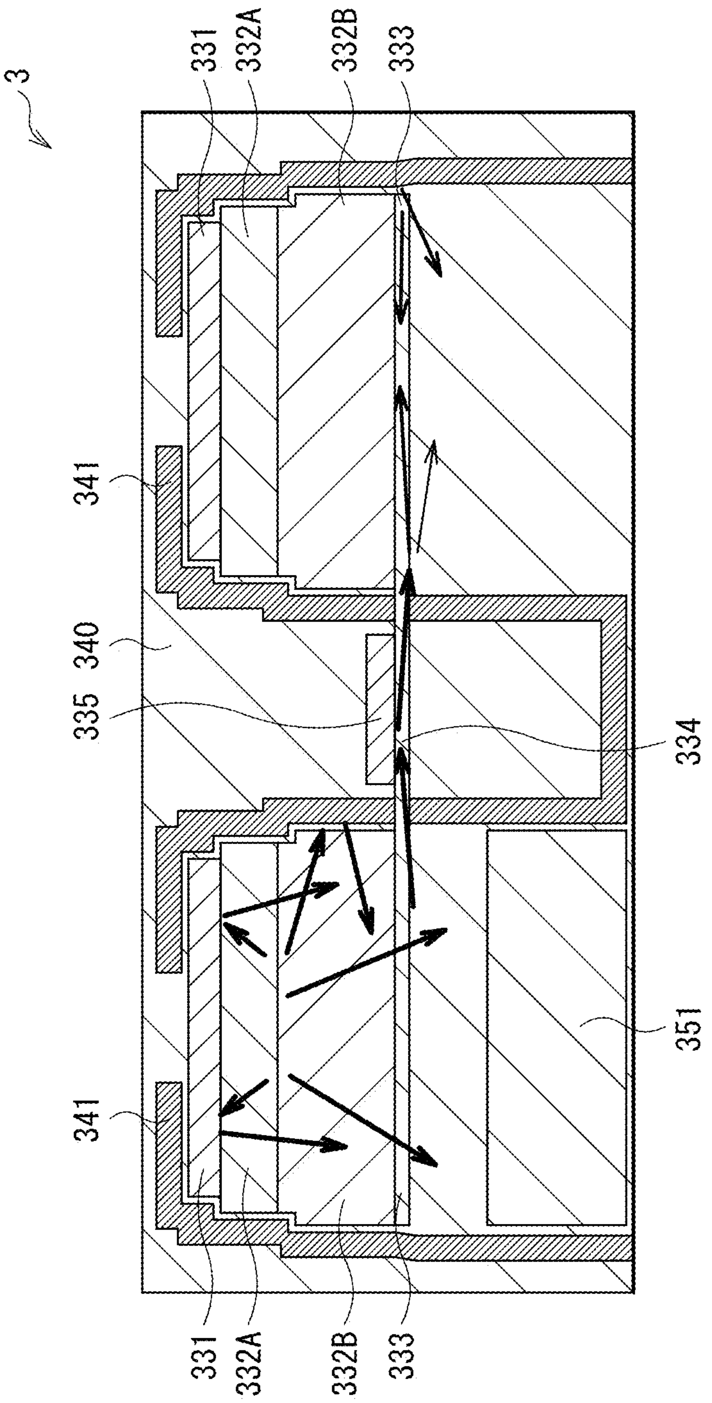
FIG. 17 is a vertical cross-sectional view of an overall configuration of a light-emitting device according to a third embodiment of the present disclosure.

Subsequently, referring to FIG. 17, an overall configuration of a light-emitting device according to a third embodiment of the present disclosure will be described. FIG. 17 is a vertical cross-sectional view of the overall configuration of the light-emitting device according to the present embodiment.

As illustrated in FIG. 17, a light-emitting device 3 according to the present embodiment includes, for example, a first light-emitting element 322A and a second light-emitting element 322B (also referred to as a light-emitting element 332, both inclusive), a pixel electrode 331, a common electrode 333, an electrode coupler 334, a contact section 335, a light-shielding section 341, an insulating layer 340, and a fluorescent layer 351.

The light-emitting element 332, the pixel electrode 331, the common electrode 333, the electrode coupler 334, the contact section 335, the light-shielding section 341, the insulating layer 340, and the fluorescent layer 351 are respectively substantially similar to the light-emitting element 132, the pixel electrode 131, the common electrode 133, the electrode coupler 134, the contact section 135, the light-shielding section 141, the insulating layer 140, and the fluorescent layer 151 described in the light-emitting device 1 according to the first embodiment.

Accordingly, as with the light-emitting device 1 according to the first embodiment, the light-emitting device 3 according to the present embodiment includes the light-emitting element 332 provided in the island-shaped structure separately for each pixel, and is therefore able to suppress the light leakage between the pixels. However, the common electrode 333 and the electrode coupler 334 couple adjacent pixels by a transparent electrically conductive material. Thus, the common electrode 333 and the electrode coupler 334 may become a propagation path of light, which can cause occurrence of the light leakage between the adjacent pixels. The light-emitting device 3 according to the present embodiment is provided with a light absorber to be described later in the electrode coupler 334, and this makes it possible to further suppress the light leakage between the adjacent pixels through the electrode coupler 334. The electrode coupler 334 and the light absorber will be described in detail later by referring to FIG. 18.

(3.2. Detailed Configuration)

Figure 18:
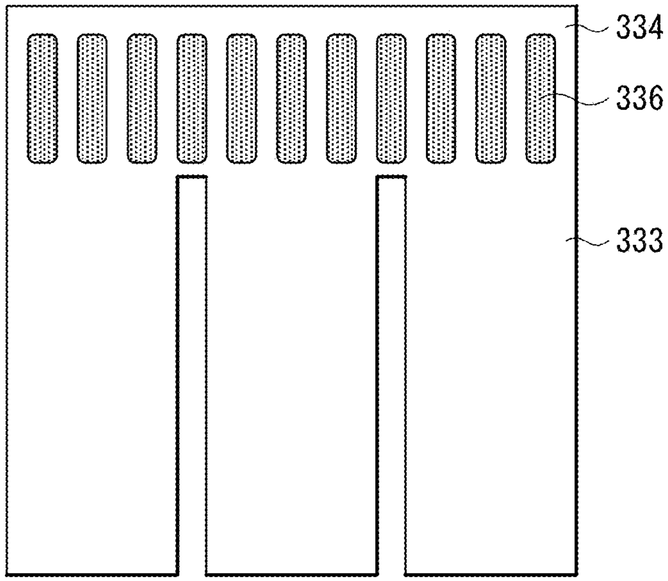
FIG. 18 is a plan view in which a common electrode and an electrode coupler are extracted.

Next, referring to FIG. 18, the detailed configuration of the light-emitting device 3 according to the present embodiment will be described. FIG. 18 is a plan view in which the common electrode 333 and the electrode coupler 334 are extracted.

As illustrated in FIG. 18, the common electrode 333 and the electrode coupler 334 may have a single-layer structure or a multiple-layer stacked structure including a transparent electrically conductive material such as ITO, IZO, ZnO, SnO, or TiO, may include an identical material, and may be provided integrally on an identical layer. The electrode coupler 334 may be electrically coupled to the common electrodes 333 of the respective pixels from the side in the same direction on a plane to be provided in such a manner as to have a planar shape of a comb.

Here, provided inside the electrode coupler 334 is a light absorber 336 including a material having a light absorptance higher than a light absorptance of the transparent electrically conductive material included in the electrode coupler 334. Specifically, the material included in the light absorber 336 is not particularly limited as long as the material has a light-absorbing property, and may be a metal material such as W, Ti, TiN, Cu, Al, or Ni, or an organic material such as carbon. The light absorber 336 is included inside the electrode coupler 334. This makes it possible to attenuate light in accordance with the light absorptance when reflecting light propagating inside the electrode coupler 334.

The light absorber 336 may have any shape and may be provided in any arrangement. For example, as illustrated in FIG. 18, the light absorber 336 may be provided as a plurality of slit shapes extending in the same direction. The slit-shapes of the light absorber 336 are arranged in a direction perpendicular to the extending method. This makes it possible to further efficiently attenuate the light propagating inside the electrode coupler 334.

The light-emitting device 3 according to the present embodiment includes the light absorber 336 inside the electrode coupler 334, and is therefore able to suppress the light from leaking into the adjacent pixel by using the electrode coupler 334 as a propagation path.

(3.3. Manufacturing Method)

Next, referring to FIGS. 19A to 20B, a method of manufacturing the light-emitting device 3 according to the present embodiment will be described. Hereinafter, only a method of forming the electrode coupler 334 which includes, inside thereof, the light absorber 336 will be described. The other processes of the method of manufacturing the light-emitting device 3 according to the present embodiment are similar to those of the method of manufacturing the light-emitting device 1 according to the first embodiment, and the description of the other processes is omitted here.

(First Manufacturing Method)

FIGS. 19A to 19G are each a vertical cross-sectional view of one process included in a first method of manufacturing the light-emitting device 3 according to the present embodiment. The first manufacturing method is a method of forming the electrode coupler 334 first, and thereafter forming the light absorber 336.

Figure 19A:
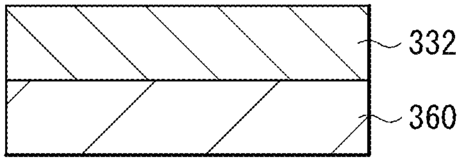
FIG. 19A is a vertical cross-sectional view of one process included in a first method of manufacturing the light-emitting device according to the embodiment.

First, as illustrated in FIG. 19A, the light-emitting element 332 is formed by epitaxially growing the group III-V compound semiconductor on a crystal growth substrate 360 including Si, sapphire, or the like. The light-emitting element 332 may be formed by sequentially stacking the group III-V compound semiconductors in the order of, for example, p-GaN, p-AlGaN, the multi-quantum-well structure (MQWs), n-GaN, and u-GaN.

Figure 19B:
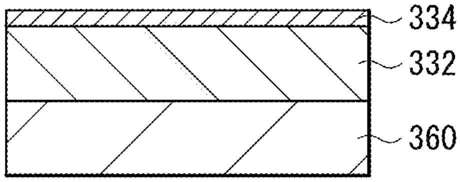
FIG. 19B is a vertical cross-sectional view of one process included in the first method of manufacturing the light-emitting device according to the embodiment.

Thereafter, as illustrated in FIG. 19B, a film of a transparent electrically conductive material such as ITO, IZO, ZnO, SnO, or TiO is formed on the light-emitting element 332 to thereby form the electrode coupler 334 and the common electrode 333 (not illustrated).

Figure 19C:
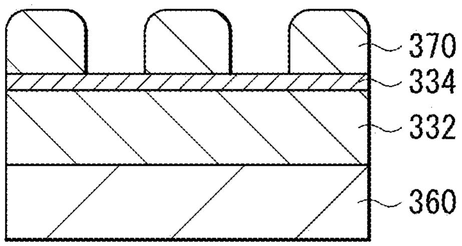
FIG. 19C is a vertical cross-sectional view of one process included in the first method of manufacturing the light-emitting device according to the embodiment.

Thereafter, as illustrated in FIG. 19C, a resist 370 that is patterned is formed on the electrode coupler 334 using lithography.

Figure 19D:
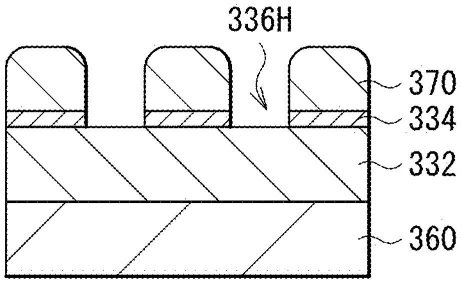
FIG. 19D is a vertical cross-sectional view of one process included in the first method of manufacturing the light-emitting device according to the embodiment.

Thereafter, as illustrated in FIG. 19D, a portion of the electrode coupler 334 is removed by dry etching or wet etching using the resist 370 as a mask to thereby form an opening 336H. The opening 336H is provided to form the light absorber 336 in a process of a subsequent stage.

Figure 19E:
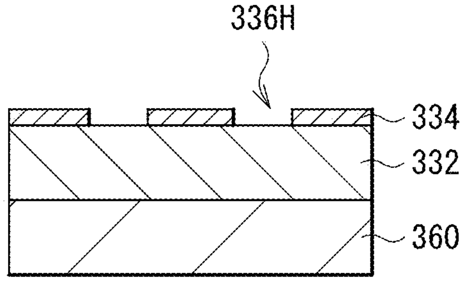
FIG. 19E is a vertical cross-sectional view of one process included in the first method of manufacturing the light-emitting device according to the embodiment.

Thereafter, as illustrated in FIG. 19E, the resist 370 is removed from the electrode coupler 334.

Figure 19F:
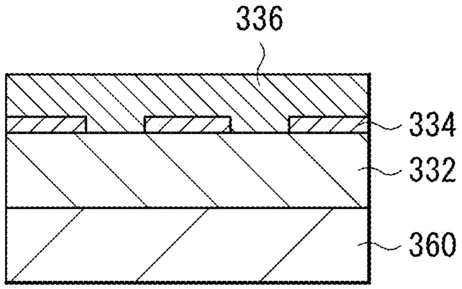
FIG. 19F is a vertical cross-sectional view of one process included in the first method of manufacturing the light-emitting device according to the embodiment.

Thereafter, as illustrated in FIG. 19F, a film of a metal material such as W, Ti, TiN, Cu, Al, or Ni is formed in such a manner as to fill the opening 336H to thereby form the light absorber 336.

Figure 19G:
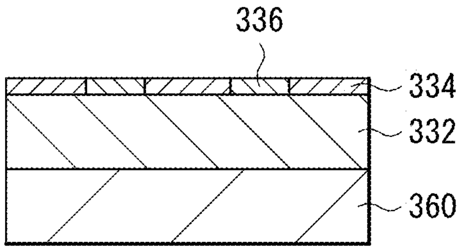
FIG. 19G is a vertical cross-sectional view of one process included in the first method of manufacturing the light-emitting device according to the embodiment.

Thereafter, as illustrated in FIG. 19G, the light absorber 336 formed on the electrode coupler 334 is removed by CMP (Chemical Mechanical Polishing), dry etching, or the like. This makes it possible to form the electrode coupler 334 including, inside thereof, the light absorber 336.

(Second Manufacturing Method)

Figure 20A:
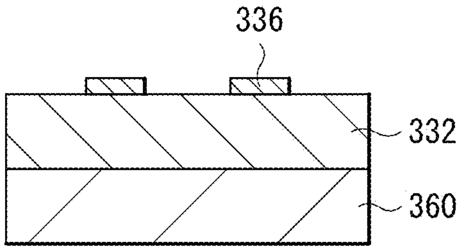
FIG. 20A is a vertical cross-sectional view of one process included in a second method of manufacturing the light-emitting device according to the embodiment.
Figure 20B:
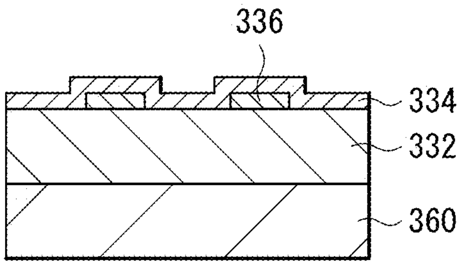
FIG. 20B is a vertical cross-sectional view of one process included in the second method of manufacturing the light-emitting device according to the embodiment.

FIGS. 20A to 20B are each a vertical cross-sectional view of one process included in a second method of manufacturing the light-emitting device 3 according to the present embodiment. The second manufacturing method is a method of forming the light absorber 336 first, and thereafter forming the electrode coupler 334.

First, as with FIG. 19A, the light-emitting element 332 is formed by epitaxially growing t the group III-V compound semiconductor on the crystal growth substrate 360.

Thereafter, as illustrated in FIG. 20A, a film of a metal material such as W, Ti, TiN, Cu, Al, or Ni is formed on the light-emitting element 332 and patterned by lithography or the like to thereby form the light absorber 336.

Thereafter, as illustrated in FIG. 20B, a film of a transparent electrically conductive material such as ITO, IZO, ZnO, SnO, or TiO is formed on the light absorber 336 and the light-emitting element 332 to thereby form the electrode coupler 334 and the common electrode 333 (not illustrated).

Thereafter, as with FIG. 19G, the electrode coupler 334 formed on the light absorber 336 is removed by CMP (Chemical Mechanical Polishing), dry etching, or the like. This makes it possible to form the electrode coupler 334 including, inside thereof, the light absorber 336.

(3.4. Modification Examples)

Subsequently, referring to FIGS. 21 to 25, first to fifth modification examples of the light-emitting device 3 according to the present embodiment will be described.

First Modification Example

Figure 21:
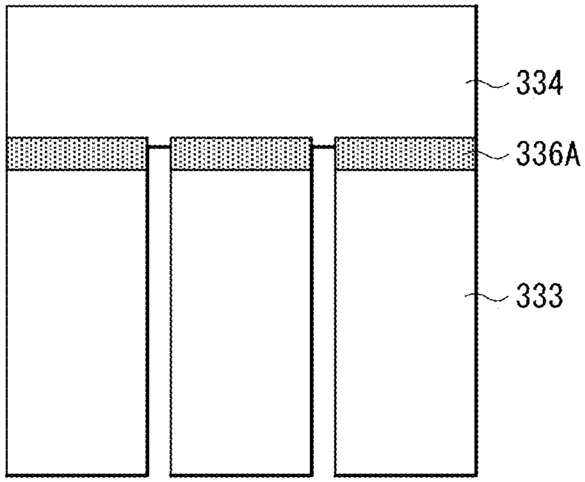
FIG. 21 is a plan view of a planar shape of a common electrode, an electrode coupler, and a light absorber included in a light-emitting device according to a first modification example of the embodiment.

FIG. 21 is a plan view of a planar shape of the common electrode 333, the electrode coupler 334, and a light absorber 336A included in a light-emitting device according to a first modification example. For example, as illustrated in FIG. 21, the light absorber 336A may be provided at a coupling portion between the common electrode 333 and the electrode coupler 334. In such a case, light propagation from the common electrode 333 to the electrode coupler 334 is blocked by the light absorber 336A, which makes it possible for the light-emitting device 3 to prevent the light leakage between the pixels through the electrode coupler 334 from occurring. It is to be noted that, in the first modification example, the light absorber 336A includes an electrically conductive metal material such as W, Ti, TiN, Cu, Al, or Ni.

Second Modification Example

Figure 22:
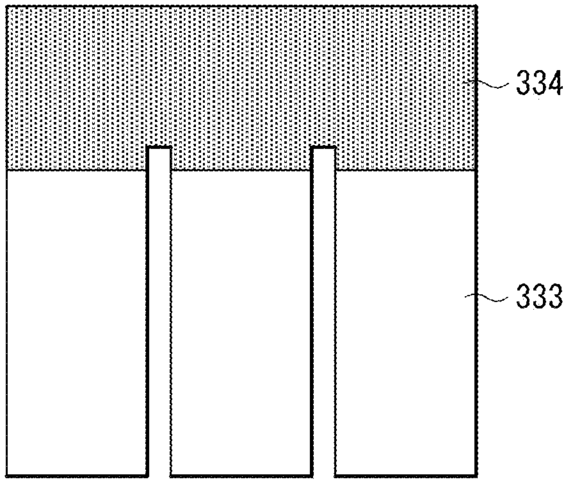
FIG. 22 is a plan view of a planar shape of a common electrode, an electrode coupler, and a light absorber included in a light-emitting device according to a second modification example of the embodiment.

FIG. 22 is a plan view of a planar shape of the common electrode 333, the electrode coupler 334, and a light absorber 336B included in a light-emitting device according to a second modification example. For example, as illustrated in FIG. 22, the light absorber 336B may be spread over the entire electrode coupler 334. In such a case, light that propagates from the common electrode 333 is absorbed by the electrode coupler 334 (i.e., the light absorber 336B), which makes it possible for the light-emitting device 3 to prevent the light leakage between the pixels through the electrode coupler 334 from occurring. It is to be noted that, in the second modification example, the light absorber 336B includes an electrically conductive metal material such as W, Ti, TiN, Cu, Al, or Ni.

Third Modification Example

Figure 23:
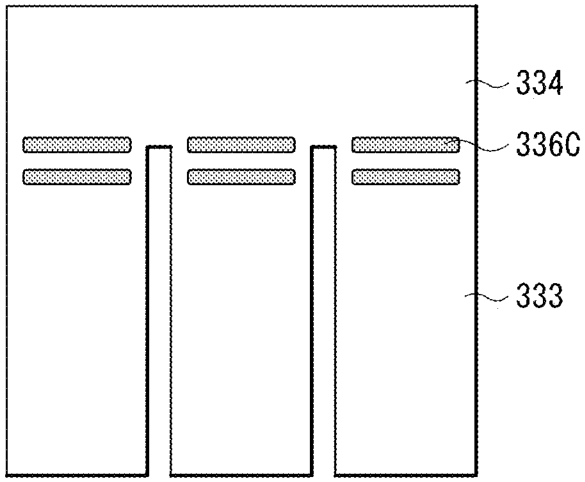
FIG. 23 is a plan view of a planar shape of a common electrode, an electrode coupler, and a light absorber included in a light-emitting device according to a third modification example of the embodiment.

FIG. 23 is a plan view of a planar shape of the common electrode 333, the electrode coupler 334, and a light absorber 336C included in a light-emitting device according to a third modification example. For example, as illustrated in FIG. 23, the light absorber 336C may be provided as slit-shaped islands. Specifically, the light absorber 336C may be provided as the plurality of slit-shaped islands extending in the same direction. Such a light absorber 336C may be provided at the coupling portion between the common electrode 333 and the electrode coupler 334. In such a case, the light absorber 336C is able to attenuate light propagating from the common electrode 333 to the electrode coupler 334 by the reflection, which makes it possible for the light-emitting device 3 to prevent the light leakage between the pixels through the electrode coupler 334 from occurring. Further, the light absorber 336C is provided as the island shapes, and this allows the electrode coupler 334 to electrically couple adjacent common electrodes 333 to each other without interruption. According to this, the electrode coupler 334 is able to prevent an interface between the light absorber 336C and the common electrode 333, and the electrode coupler 334 from being formed that cause interface resistance in the middle of a conductive path.

Fourth Modification Example

Figure 24:
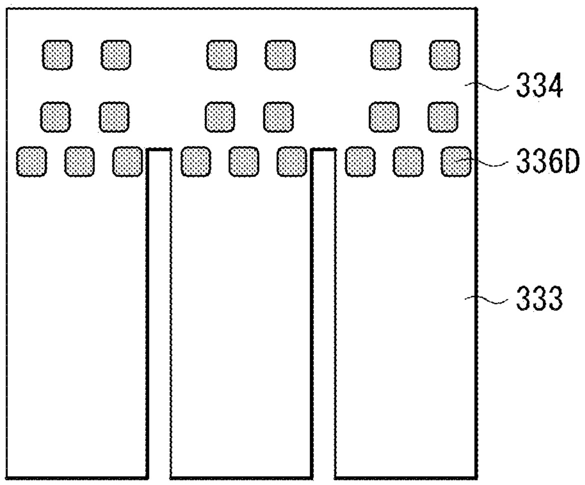
FIG. 24 is a plan view of a planar shape of a common electrode, an electrode coupler, and a light absorber included in a light-emitting device according to a fourth modification example of the embodiment.

FIG. 24 is a plan view of a planar shape of the common electrode 333, the electrode coupler 334, and a light absorber 336D included in a light-emitting device according to a fourth modification example. For example, as illustrated in FIG. 24, the light absorber 336D may be provided as dot-shaped islands. Specifically, the light absorber 336D may be provided as the plurality of rectangular-dot-shaped islands arranged alternately or the like. Such a light absorber 336D may be provided on the electrode coupler 334. In such a case, the light absorber 336D is able to attenuate light propagating from the common electrode 333 to the electrode coupler 334 by the reflection, which makes it possible for the light-emitting device 3 to prevent the light leakage between the pixels through the electrode coupler 334 from occurring. Further, the light absorber 336D is provided as the island shapes, and this allows the electrode coupler 334 to electrically couple adjacent common electrodes 333 to each other without interruption. According to this, the electrode coupler 334 is able to prevent the interface between the light absorber 336D and the common electrode 333, and the electrode coupler 334 from being formed that cause the interface resistance in the middle of the conductive path.

Fifth Modification Example

Figure 25:
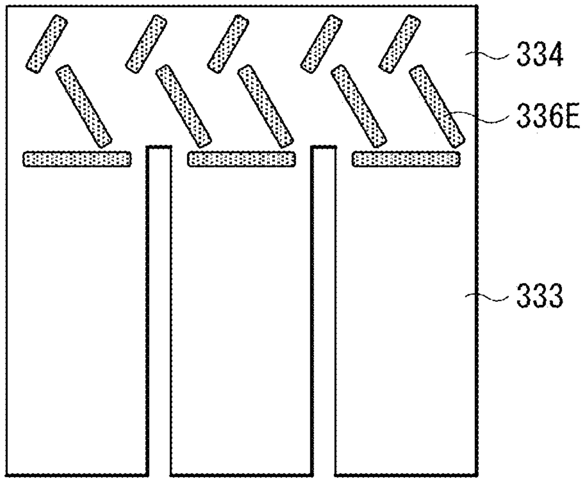
FIG. 25 is a plan view of a planar shape of a common electrode, an electrode coupler, and a light absorber included in a light-emitting device according to a fifth modification example of the embodiment.

FIG. 25 is a plan view of a planar shape of the common electrode 333, the electrode coupler 334, and a light absorber 336E included in a light-emitting device according to a fifth modification example. For example, as illustrated in FIG. 25, the light absorber 336E may be provided as slit-shaped islands. Specifically, the light absorber 336E may be provided as the plurality of slit-shaped islands extending in a plurality of directions. In such a case, the light absorber 336E is able to attenuate light propagated to the electrode coupler 334 by the reflection, which makes it possible for the light-emitting device 3 to prevent the light leakage between the pixels through the electrode coupler 334 from occurring. Further, the light absorber 336E is provided as the island shapes, and this allows the electrode coupler 334 to electrically couple adjacent common electrodes 333 to each other without interruption. According to this, the electrode coupler 334 is able to prevent the interface between the light absorber 336E and the common electrode 333, and the electrode coupler 334 from being formed that cause the interface resistance in the middle of the conductive path.

4. Application Examples

Figure 26:
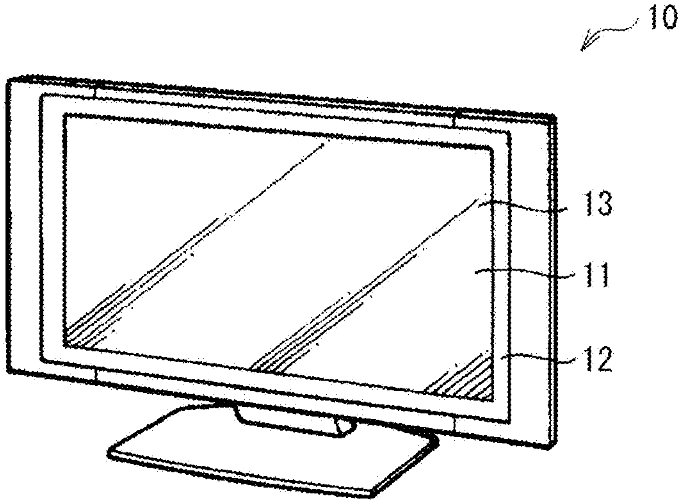
FIG. 26 is a schematic view of an external appearance of a television device to which a light-emitting device according to one embodiment of the present disclosure is applied.

The light-emitting devices 1, 2, and 3 according to one embodiment of the present disclosure are applicable to various types of display devices each of which displays an image signal that has been inputted from an outside the display device or an image signal that has been generated inside the display device. For example, the light-emitting devices 1, 2, and 3 according to the present embodiment are applicable to a television device, a digital camera, a laptop personal computer, a mobile phone, a smartphone, or the like. With reference to FIG. 26, one of the application examples of the light-emitting devices 1, 2, and 3 according to the present embodiment is indicated. FIG. 26 is a schematic view of an external appearance of a television device to which the light-emitting devices 1, 2, and 3 according to the present embodiment is applied.

As illustrated in FIG. 26, a television device 10 includes, for example, an image display 11 that includes a front panel 12 and a filter glass 13. The light-emitting devices 1, 2, and 3 according to the present embodiment may be applied to the image display 11.

The technology according to the present disclosure has been described with reference to the first to third embodiments and the modification examples. However, the technology according to the present disclosure is not limited to the foregoing embodiments, etc., and may be modified in a variety of ways.

In addition, not all of the configuration and the operation described in the above embodiments are indispensable as the configuration and the operation of the present disclosure. For example, among the components in the above-described embodiments, components not described in the independent claims indicating the most significant concepts of the present disclosure are to be understood as optional components.

The terms used throughout this specification and the appended claims should be construed as "non-limiting" terms. For example, the term "comprising" or "being comprised" should be construed as "not being limited to the mode recited as being comprised". The term "including" should be construed as "not being limited to the mode recited as being included".

The terms used herein are used merely for convenience of explanation and include terms that are not used to limit the configuration and operation. For example, the terms "right", "left", "top", "bottom", and the like each merely indicate a direction on the drawing being referred to. The terms "inner side" and "outer side" each merely indicate a direction toward the center of an element of interest and a direction away from the center of the element of interest, respectively. The same applies to terms similar to these terms and terms having similar meaning.

It is to be noted that the technology according to the present disclosure may have the following configurations. According to the technology of the present disclosure having the following configurations, the pixel electrode, the light-emitting element, and the common electrode included in one pixel are separated from the pixel electrode, the light-emitting element, and the common electrode included in a pixel adjacent to the one pixel. Accordingly, the light-emitting device and the display device of the present embodiment are able to suppress the occurrence of the light leakage between the adjacent pixels through the pixel electrode, the light-emitting element, and the common electrode. Effects according to the technology of the disclosure are not necessarily limited to those described herein. The present disclosure may further include any effects other than those described herein.

(1)

A light-emitting device including:

a light-emitting element provided separately for each of pixels;

a pixel electrode provided on a side of a first surface of the light-emitting element, the pixel electrode being provided for each of the pixels;

a common electrode provided on a side of a second surface of the light-emitting element, the second surface being opposite to the first surface, the common electrode being provided separately for each of the pixels that are adjacent to each other; and an electrode coupler that electrically couples a plurality of the common electrodes provided for the respective pixels to each other in a plane region that is different from a plane region in which the light-emitting element is provided.

(2)

The light-emitting device according to (1), in which the common electrode and the electrode coupler include an identical material and provided integrally on an identical layer.

(3)

The light-emitting device according to (2), in which the electrode coupler electrically couples the common electrodes provided for the respective pixels to each other from a side in an identical direction.

(4)

The light-emitting device according to (3), in which the common electrodes of the respective pixels and the electrode coupler have a comb shape as a whole.

(5)

The light-emitting device according to (1), in which the electrode coupler has a height extending from the common electrode to the pixel electrode, and has a planar shape that surrounds peripheries of the respective pixels.

(6)

The light-emitting device according to (5), in which the electrode coupler is separated from the light-emitting element.

(7)

The light-emitting device according to (6), in which the electrode coupler includes a light-shielding material.

(8)

The light-emitting device according to any one of (5) to (7), in which the common electrode is provided on a side surface of a lowermost layer, of a stacked structure of the light-emitting element, on the side of the second surface.

(9)

The light-emitting device according to (1), in which the common electrode includes a transparent electrically conductive material, and the electrode coupler further includes a light absorber, the light absorber including a material having a light absorptance higher than a light absorptance of the transparent electrically conductive material.

(10)

The light-emitting device according to (9), in which the electrode coupler includes the transparent electrically conductive material, and the light absorber is provided inside the electrode coupler and is provided as a planar shape of an island.

(11)

The light-emitting device according to (10), in which the light absorber is provided as a plurality of dot shapes.

(12)

The light-emitting device according to (10), in which the light absorber is provided as a plurality of slit shapes extending in one direction or extending in a plurality of directions.

(13)

The light-emitting device according to any one of (10) to (12), in which the light absorber includes a metal material.

(14)

The light-emitting device according to any one of (1) to (13), in which the electrode coupler further includes a contact section that is electrically coupleable from a side identical to a side on which the pixel electrode is present.

(15)

The light-emitting device according to any one of (1) to (14), in which the common electrode includes a transparent electrically conductive material.

(16)

The light-emitting device according to any one of (1) to (15), in which the light-emitting element includes a group III-V compound semiconductor.

(17)

A display device including:

a light-emitting element provided separately for each of pixels;

a pixel electrode provided on a side of a first surface of the light-emitting element, the pixel electrode being provided for each of the pixels;

a common electrode provided on a side of a second surface of the light-emitting element, the second surface being opposite to the first surface, the common electrode being provided separately for each of the pixels that are adjacent to each other; and an electrode coupler that electrically couples a plurality of the common electrodes provided for the respective pixels to each other in a plane region that is different from a plane region in which the light-emitting element is provided.

This application claims the benefit of Japanese Priority Patent Application JP2020-103815 filed with the Japan Patent Office on Jun. 16, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light-emitting device, comprising:

a light-emitting element provided for each pixel of a plurality of pixels;

a pixel electrode provided on a first surface side of the light-emitting element, the pixel electrode being provided for each of the plurality of pixels;

a common electrode provided on a second surface side of the light-emitting element, the second surface side being opposite to the first surface side, the common electrode being provided separately for adjacent pixels;

an electrode coupler that electrically couples a plurality of the common electrodes provided for the respective pixels to each other in a plane region different from a plane region in which the light-emitting element is provided, and a light-shielding film covering upper portions of the pixel electrode and vertical side portions of each of the light emitting element, the common electrode and the electrode coupler, wherein the light-shielding film comprises at least one material selected from titanium (Ti), titanium nitride (TN), copper (Cu), nickel (Ni) or an organic material containing carbon.

2. The light-emitting device according to claim 1, wherein the common electrode and the electrode coupler are formed of an identical material and integrally provided on an identical layer.

3. The light-emitting device according to claim 2, wherein the electrode coupler electrically couples the common electrodes provided for the respective pixels to each other in a same direction.

4. The light-emitting device according to claim 3, wherein the common electrodes of the respective pixels and the electrode coupler collectively have a comb-shaped configuration.

5. The light-emitting device according to claim 1, wherein the common electrode includes a transparent electrically conductive material, and the electrode coupler further includes a light absorber, the light absorber including a material having a light absorptance higher than a light absorptance of the transparent electrically conductive material.

6. The light-emitting device according to claim 5, wherein the electrode coupler includes the transparent electrically conductive material, and the light absorber is provided inside the electrode coupler and is provided as a planar shape of an island.

7. The light-emitting device according to claim 6, wherein the light absorber is provided as a plurality of dot shapes.

8. The light-emitting device according to claim 6, wherein the light absorber is provided as a plurality of slit shapes extending in one direction or extending in a plurality of directions.

9. The light-emitting device according to claim 6, wherein the light absorber includes a metal material.

10. The light-emitting device according to claim 1, wherein the electrode coupler further includes a contact section that is electrically couplable from a side identical to a side on which the pixel electrode is provided.

11. The light-emitting device according to claim 1, wherein the common electrode includes a transparent electrically conductive material.

12. The light-emitting device according to claim 1, wherein the light-emitting element includes a group III-V compound semiconductor.

13. A display device, comprising:

a light-emitting element provided for each pixel of a plurality of pixels;

a pixel electrode provided on a first surface side of the light-emitting element, the pixel electrode being provided for each of the plurality of pixels;

a common electrode provided on a second surface side of the light-emitting element, the second surface side being opposite to the first surface side, the common electrode being provided separately for adjacent pixels;

an electrode coupler that electrically couples a plurality of the common electrodes provided for the respective pixels to each other in a plane region different from a plane region in which the light-emitting element is provided, and a light-shielding film covering upper portions of the pixel electrode and vertical side portions of each of the light emitting element, the common electrode and the electrode coupler, wherein the light-shielding film comprises at least one material selected from titanium (Ti), titanium nitride (TN), copper (Cu), nickel (Ni) or an organic material containing carbon.

14. The display device according to claim 13, wherein the common electrode and the electrode coupler are formed of an identical material and integrally provided on an identical layer.

15. The display device according to claim 14, wherein the electrode coupler electrically couples the common electrodes provided for the respective pixels to each other in a same direction.

16. The display device according to claim 15, wherein the common electrodes of the respective pixels and the electrode coupler collectively have a comb-shaped configuration.

* * * * *